(12) United States Patent
Sakimura et al.

(10) Patent No.: US 8,902,644 B2
(45) Date of Patent: Dec. 2, 2014

(54) SEMICONDUCTOR STORAGE DEVICE AND ITS MANUFACTURING METHOD

(75) Inventors: Noboru Sakimura, Tokyo (JP);
Ryusuke Nebashi, Tokyo (JP);
Tadahiko Sugibayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/824,888

(22) PCT Filed: Dec. 6, 2011

(86) PCT No.: PCT/JP2011/078215
§ 371 (c)(1),
(2), (4) Date: Mar. 18, 2013

(87) PCT Pub. No.: WO2012/081453
PCT Pub. Date: Jun. 21, 2012

(65) Prior Publication Data
US 2013/0182501 A1    Jul. 18, 2013

(30) Foreign Application Priority Data
Dec. 14, 2010  (JP) ................................ 2010-277866

(51) Int. Cl.
*G11C 11/00* (2006.01)
*G11C 11/14* (2006.01)
*H01L 29/82* (2006.01)
*H01L 27/22* (2006.01)
*H01L 43/12* (2006.01)
*G11C 11/16* (2006.01)

(52) U.S. Cl.
CPC .............. *H01L 27/228* (2013.01); *H01L 43/12* (2013.01); *G11C 11/161* (2013.01); *G11C 11/1653* (2013.01)
USPC .... 365/158; 365/171; 257/421; 257/E21.665; 257/E29.323

(58) Field of Classification Search
USPC .......................................... 365/158
See application file for complete search history.

(56) References Cited

U.S. PATENT DOCUMENTS 8,009,466 B2 *  8/2011  Sakimura et al. .............. 365/158
8,009,467 B2 *  8/2011  Nebashi et al. ................ 365/158
(Continued)

FOREIGN PATENT DOCUMENTS

| JP | 2002-151661 A | 5/2002 |
|---|---|---|
| JP | 2003-297069 A | 10/2003 |
| JP | 2004-348934 A | 12/2004 |
| JP | 2009-099625 A | 5/2009 |
| WO | WO 2006/054588 A1 | 5/2006 |
| WO | WO 2008/102650 A1 | 8/2008 |
| WO | WO 2009/060783 A1 | 5/2009 |

OTHER PUBLICATIONS

English translation of PCT/ISA/237 (written opinion of the international searching authority, dated Feb. 28, 2012).
PCT/IB/373 dated Jun. 18, 2013.
International Search Report (ISR) (PCT Form PCT/ISA/210), in PCT/JP2011/078215, dated Feb. 28, 2012.

*Primary Examiner* — Son Mai
(74) *Attorney, Agent, or Firm* — McGinn IP Law Group, PLLC

(57) ABSTRACT

A magnetoresistive element 10 having a memory cell 100 according to the present invention contains a first lower terminal n1 and a second lower terminal n2 respectively connected to both ends of a conductive layer 3 whose longitudinal direction is different from the column direction (X direction). Further, the gates of the first transistors M1 respectively included in two memory cells among the plurality of memory cells 100 and adjacent to each other in a row direction (Y direction) are commonly connected to a first word line 14. As a result, without increase of the cell area, it becomes possible to reserve a margin in the dimension of the cell structure or in the process for MRMA.

10 Claims, 41 Drawing Sheets

(56) References Cited

U.S. PATENT DOCUMENTS

| | | | |
|---|---|---|---|
| 8,542,519 B2* | 9/2013 | Asao et al. | 365/148 |
| 2002/0057593 A1 | 5/2002 | Hidaka | |
| 2003/0223283 A1 | 12/2003 | Kunikiyo | |
| 2004/0047196 A1 | 3/2004 | Hidaka | |
| 2007/0091670 A1 | 4/2007 | Hidaka | |
| 2009/0154225 A1 | 6/2009 | Hidaka | |
| 2010/0097845 A1 | 4/2010 | Sakimura et al. | |
| 2010/0238719 A1 | 9/2010 | Nebashi et al. | |
| 2011/0002163 A1* | 1/2011 | Fukami et al. | 365/173 |
| 2013/0114336 A1* | 5/2013 | Li et al. | 365/171 |

* cited by examiner

Fig. 15

| ROW ADDRESS (x) | 13-0 | 14-0 | 13-1 | 13-2 | 14-1 | 13-3 | 13-4 | 14-2 | 13-5 | 13-6 | 14-3 | 13-7 |
|---|---|---|---|---|---|---|---|---|---|---|---|---|
| 0 | H | H | L | L | L | L | L | L | L | L | L | L |
| 1 | L | H | H | L | L | L | L | L | L | L | L | L |
| 2 | L | L | L | H | H | L | L | L | L | L | L | L |
| 3 | L | L | L | L | H | H | L | L | L | L | L | L |
| 4 | L | L | L | L | L | L | H | H | L | L | L | L |
| 5 | L | L | L | L | L | L | L | H | H | L | L | L |
| 6 | L | L | L | L | L | L | L | L | L | H | H | L |
| 7 | L | L | L | L | L | L | L | L | L | L | H | H |

Fig. 30

| ROW ADDRESS (x) | 14-0 | 13-0 | 14-1 | 13-1 | 14-2 | 13-2 | 14-3 | 13-3 | 14-4 | 13-4 | 14-5 | 13-5 | 14-6 | 13-6 | 14-7 | 13-7 | 14-8 |
|---|---|---|---|---|---|---|---|---|---|---|---|---|---|---|---|---|---|
| 0 | H | L | L | L | L | L | L | L | L | L | L | L | L | L | L | L | L |
| 1 | L | H | H | L | L | L | L | L | L | L | L | L | L | L | L | L | L |
| 2 | L | L | L | H | H | L | L | L | L | L | L | L | L | L | L | L | L |
| 3 | L | L | L | L | L | H | H | L | L | L | L | L | L | L | L | L | L |
| 4 | L | L | L | L | L | L | L | H | H | L | L | L | L | L | L | L | L |
| 5 | L | L | L | L | L | L | L | L | L | H | H | L | L | L | L | L | L |
| 6 | L | L | L | L | L | L | L | L | L | L | L | H | H | L | L | L | L |
| 7 | L | L | L | L | L | L | L | L | L | L | L | L | L | H | H | H | H |

SEMICONDUCTOR STORAGE DEVICE AND ITS MANUFACTURING METHOD

TECHNICAL FIELD

The present invention relates to a magnetic random access memory (MRAM) and more particularly relates to a layout of the MRAM.

BACKGROUND ART

The magnetic random access memory (hereafter, referred to as MRAM) is a nonvolatile memory in which the number of reading/writing operations are unlimited and a low voltage operation and a high speed operation are possible. A memory cell of the MRAM includes a magnetoresistive element (exemplified by the MTJ (Magnetic Tunneling Junction) element) as an element for storing data.

As a writing method of the memory cell of the MRAM, the dual-axis writing method has been used. In the dual-axis writing method, a writing current is made flow through each of two interconnections (exemplified by a word line and a bit line) orthogonal to each other. Then, the magnetization of the magnetoresistive element of a selected memory cell (hereafter, referred to as a selected cell) is inverted by a synthetic magnetic field generated by the currents. The memory cell of the dual-axis writing type MRAM has the 1T1MTJ cell configuration. That is, the memory cell is configured by one MTJ element (1MTJ) functioning as the magnetoresistive element and one cell transistor (1T) to select the memory cell at the time of a reading operation. The area of this memory cell has a possibility that enables to ideally attain 8 $F^2$ (F indicates the dimension of the smallest interconnection width and interconnection interval in manufacturing) and attain a cell size similar to the DRAM (Dynamic Random Access Memory). However, in the dual-axis writing method, there is a situation (hereafter, referred to as a half-selection state) in which the magnetic field is also applied to a non-selected memory cell (hereafter, referred to as a non-selected cell). For this reason, there is a defect that a writing operational margin is narrow. Also, since the typical writing current is large such as about 5 mA, it is difficult to increase the cell occupation rate and make the capacity large.

In order to solve the above problems, several techniques have been proposed. For example, by using the MRAM of the 2T1MTJ cell configuration, it is possible to solve the subject of the half-selection state, reduce the writing current to 1 mA or less and simplify peripheral circuits. Thus, the cell occupation rate can be increased similarly to the rate of the DRAM. As a result, it is suitable for attaining a larger capacity. An MRAM of the 2T1MTJ cell configuration is disclosed in, for example, Japanese Patent Application Publication JP2004-348934A (which is referred to as the patent literature 1).

FIGS. 1A and 1B are circuit diagrams showing the configuration of the MRAM cell (memory cell 200) described in the patent literature 1. As shown in FIGS. 1A and 1B, the memory cell 200 of the 2T1MTJ cell configuration is provided with one MTJ element (1MTJ) functioning as the magnetoresistive element and two cell transistors M100 and M200 (2T) to select the memory cell at the times of a writing operation and a reading operation.

The operation of the memory cell 200 of the 2T1MTJ cell configuration will be described below with reference to FIGS. 1A and 1B. At the time of the writing operation, when a word line 230 (WL) is shifted to the high level, the two transistors M100 and M200 are turned on. Together with it, a complementary voltage corresponding to a 1-bit writing information is applied to a bit line 210 (BL) and a bit line 220 (/BL). For example, when "0" is written to a selected cell, the complementary voltage of the low level (VL) is applied to the bit line 210 (BL), and the complementary voltage of the high level (VH) is applied to the bit line 220 (/BL). Similarly, when "1" is written to the selected cell, the complementary voltage of the high level is applied to the bit line 210 (BL), and the complementary voltage of the low level is applied to the bit line 220 (/BL). With those operations, as shown in FIG. 1A, a writing current $I_W$ is conducted between the transistors M100 and M200. Thus, the magnetization state of only an MTJ element 300 of the selected cell is inverted, and the 1-bit information of only the selected cell is rewritten. That is, in the case of the 2T1MTJ cell configuration, it is possible to improve the selectivity of the memory cell at the time of the writing operation.

As shown in FIG. 1B, also at the time of the reading operation, a reading current $I_S$ can be conducted to only the selected cells through the two transistors M100 and M200. In this case, when a voltage $V_C$ of about 0.3V is applied to both of the bit line 210 (BL) and the bit line 220 (/BL), the reading current $I_S$ flows through the transistors M100 and M200 of the selected cells to the MTJ element 300 whose one side terminal n30 is grounded. By detecting this current $I_S$, it is possible to detect the resistance value of the MTJ element 300 and read the information recorded in the selected cell.

For the memory cell 200 of the 2T1MTJ configuration, it is desired to use an MTJ element 300 of three terminals, as shown in FIG. 1A. FIGS. 2 and 3 are cross-sectional views showing the structure of typical 3-terminal MTJ elements (MTJ element 300). FIG. 2 is the cross-sectional view showing the structure of an MTJ element 300 of the magnetic field writing type. The MTJ element 300 shown in FIG. 2 contains a nonmagnetic metal layer 204 whose both ends are a lower terminal n10 and a lower terminal n20, a free magnetic layer 203, a barrier layer 202 and a pinned magnetic layer 201. On the upper layer of the nonmagnetic metal layer 204, the free magnetic layer 203, the barrier layer 202 and the pinned magnetic layer 201 are laminated in turn, and the pinned magnetic layer 201 serves as an upper terminal n30. Here, the magnetization of the pinned magnetic layer 201 is fixed to an in-surface direction. In the MTJ element 300 shown in FIG. 2, the magnetization of only the free magnetic layer 203 is inverted by the magnetic field generated by the writing current flowing through the nonmagnetic metal layer 204, and the 1-bit information can be rewritten.

Another one example of the structure of the 3-terminal MTJ element will be described with reference to FIG. 3. FIG. 3 is the cross-sectional view showing the structure of the MTJ element 300 of the domain wall displacement type. The MTJ element 300 shown in FIG. 3 contains a hard magnetic layer 208a connected to the lower terminal n10, a hard magnetic layer 208b connected to the lower terminal n20, a free magnetic layer 207, a barrier layer 206 and a reference magnetic layer 205. The free magnetic layer 207 is laminated just on the hard magnetic layers 208a and 208b. Moreover, in the free magnetic layer 207, the reference magnetic layer 205 is laminated just on a region in which the hard magnetic layers 208a and 208b are not formed in a lower layer, with the barrier layer 206 between the free magnetic layer 207 and the reference magnetic layer 205, and the reference magnetic layer 205 serves as the upper terminal n30.

FIG. 3 shows a case in which all of the magnetic layers are magnetized vertically (z direction) with respect to the lamination surface. For example, in the hard magnetic layer 208a, the magnetization is fixed upwardly (the positive side of the z direction). In the hard magnetic layer 208b, the magnetization is fixed downwardly (the negative side of the z direction). Moreover, in the reference magnetic layer 205, the magnetization is fixed upwardly. In this case, in the free magnetic layer region just on the hard magnetic layer 208a, the magnetization is fixed upwardly, and in the free magnetic layer region just on the hard magnetic layer 208b, the magnetization is fixed downwardly, respectively. A free magnetic layer region in which the hard magnetic layers 208a and 208b are not formed in the lower layer of the free magnetic layer 207 is a region in which the magnetization is freely rewritten. For this reason, a domain wall is formed on any one side of the hard magnetic layers 208a and 208b. For example, in FIG. 2(b), the domain wall is formed at a vicinity of the hard magnetic layer 208a, and the magnetization state of the free magnetic layer region in which the hard magnetic layers 208a and 208b are not formed in the lower layer becomes downward. In this state, when a current is supplied to the orientation from the terminal n20 to n10, the action of a spin polarization current causes this domain wall to be displaced rightwardly (the positive side of the X direction) and stopped at a vicinity of the hard magnetic layer 208b. Consequently, the magnetization state of the free magnetic layer region in which the hard magnetic layers 208a and 208b are not formed in the lower layer is transited upwardly. Moreover, when the current is supplied to the orientation from the terminal n10 to n20, the action of the spin polarization current causes the domain wall to be displaced leftwardly (the negative side of the X direction) and stopped at a vicinity of the hard magnetic layer 208a. Consequently, the magnetization state of the free magnetic layer region in which the hard magnetic layers 208a and 208b are not formed in the lower layer is transited downwardly. With these operations, it is possible to rewrite the 1-bit information.

The memory cells 200 shown in FIGS. 1A and 1B are arranged in matrix, and an arrayed memory array is consequently formed. FIG. 4 is a circuit diagram showing the configuration of the memory array in which the memory cells 200 shown FIGS. 1A and 1B are arrayed in the matrix of 4 rows×3 columns. FIGS. 5A to 5C are the plan views showing the layout structure of the memory array shown in FIG. 4. FIGS. 5A to 5C show an example of plan views of the memory array formed by the memory cells 200 in which the MTJ elements 300 of the domain wall displacement type are used. FIG. 6 is an A-A' cross-sectional view in FIGS. 5A to 5C.

In detail, FIG. 5A is the plan view showing the structure from the substrate to an MTJ element formation region just under the second interconnection layer M2. FIG. 5B is the plan view showing the structure from the second interconnection layer M2 to a contact formation region just under the third interconnection layer M3. FIG. 5C is the plan view showing the structure of the upper layer from the third interconnection layer.

With reference to FIGS. 5A to 5C and FIG. 6, a contact 210a and a metal interconnection 209a forming the lower terminal n10 are laminated in turn on an N+ diffusion layer 211a formed on the P-type substrate, and the hard layer 208a is formed on its upper layer. Also, a contact 210b and a metal interconnection 209b forming the lower terminal n20 are laminated in turn on an N+ diffusion layer 211b formed on the P-type substrate, and the hard layer 208b is formed on its upper layer. The free magnetic layer 207 is formed in the upper layer of the hard layers 208a and 208b, and the barrier layer 206 and the reference layer 205 are formed in the upper layer of the free magnetic layer 207 in which the hard magnetic layers 208a and 208b are not formed in the lower layer.

As exemplified in FIG. 5A, the ideal minimum area of the memory cell 200 that is minimized in a design rule is 12 $F^2$, and the bit cost becomes 1.5 times as compared with the 1T1MTJ cell configuration. However, the 2T1MTJ cell configuration can solve the subject of the half-selection state as mentioned before and can reduce the interconnection current to 1 mA or less and can further simplify peripheral circuits. For this reason, the cell occupation rate in the MRAM can be increased similarly to the rate of the DRAM. As a result, it is suitable for attaining a larger capacity.

An MRAM that includes the MTJ element of the domain wall displacement type is described in, for example, Japanese Patent Application Publication JP2009-99625A (referred to as the patent literature 2) and Japanese Patent Application Publication JP2003-297069A (referred to as the patent literature 3). In the MRAM described in the patent literature 2, as shown in FIG. 4, in the transistors M100 and M200, their source electrodes are connected to the bit line 210 (BL) and the bit line 220 (/BL), respectively, their drain electrodes are connected to the two terminals n20 and n30, respectively, and the gate electrodes are commonly connected to the word line 230. Then, the currents $I_W$ and $I_S$ are controlled by the transistors M100 and M200. In the MRAM described in the patent literature 3, in the transistors M100 and M200, their source electrodes are connected to the bit lines 210 (BL) and 220 (/BL), respectively, and the drain electrodes are connected to the two terminals n20 and n30 in the MTJ element 300, respectively, and their gate electrodes are connected to the different two word lines 230, respectively. Then, the currents $I_W$ and $I_S$ are controlled by the transistors M100 and M200.

Also, WO2006/054588 describes an MRAM in which a longitudinal direction has a magnetization free layer of 45° with respect to the word line (referred to as the patent literature 4).

CITATION LIST

Patent Literature

[PTL 1] Japanese Patent Application Publication JP 2004-348934A

[PTL 2] Japanese Patent Application Publication JP 2009-99625A

[PTL 3] Japanese Patent Application Publication JP 2003-297069A

[PTL 4] International Publication WO 2006/054588

SUMMARY OF INVENTION

For attaining the cell size of 12 $F^2$ by a cell layout in which the memory cell of 2T1MTJ configuration is minimized based on a design rule, the following problem occurs.

For example, in the MTJ element 300 of the magnetic field writing type shown in FIG. 2, the interval in the X-direction between the shape end of the via positioned at the lower terminal n10 and the lower terminal n20, and the shape end of the magnetoresistance formation region (the free magnetic layer 203—the barrier layer 202—the pinned layer 201) becomes zero. The film thickness of a typical barrier 202 is very thin at the level of 0.3 nm to 0.5 nm, so that it is required to planarize the surface of the nonmagnetic metal layer just under the magnetoresistance formation region at the level of atomic layer order for preventing the barrier layer from short-circuiting. However, in the process of manufacturing the via of the lower electrode (the lower terminals n10, n20), an unavoidable level difference occurs in the nonmagnetic metal region, especially at the via end portion, and as a consequence it becomes difficult to form the barrier layer 202 appropriately in the later process.

Similarly, for example, in the MTJ element 300 of the domain wall displacement type shown in FIG. 3, the interval between the end portion of the via at the lower terminal n10 and the lower terminal n20 and the hard magnetic layers 208*a*, 208*b*, and the end portion of the barrier layer 206 or the reference layer 205 becomes zero. For preventing the barrier layer 206 from short-circuiting, it is required to planarize the surface of the free magnetic layer 207 at the level of atomic layer order. However, in the process of manufacturing the via of the lower electrode (the lower terminals n10, n20) and the hard magnetic layers 208*a*, 208*b*, an unavoidable level difference occurs in the free magnetic layer 207, and as a consequence it becomes difficult to form the barrier layer 206 appropriately in the later process.

For reducing the influence of the via level difference, it is required to provide an interval of several times of 10 nm or more between the lower electrode via and the barrier layer.

Further, in the MTJ element 300 of the domain wall displacement type shown in FIG. 3, the width of the magnetic domain wall is several times of 10 nm, and in a case where the free layer region where the reference layer 205 is not formed is wide, the domain wall may stop in this region. Thus, it is not desirable that the interval in the X-direction between the end portion of the hard magnetic layers 208*a*, 208*b* and the end portion of the reference layer 205 is zero.

As a result of the above, the interval in the X-direction between the lower electrode via and the magnetoresistance formation region in the MTJ element 300 shown in FIG. 2, or between the hard layers 208*a*, 208*b* and the reference layer 205 is required to be separated by several times of 10 nm or more. This interval is not a negligible value as compared with the F (about the degree of F=60 nm in the 40 nm generation) of minimum size value of the interconnection forming process. As a result, the possible minimum value of the area of a cell becomes larger than the ideal value of 12 F².

For solving the above problem, in the present invention, the following means is adopted.

According to an aspect of the present invention, a semiconductor storage device contains: a plurality of memory cells arranged in a row direction (Y direction) and in a column direction (X direction) being orthogonal to the row direction; a first word line extending in the column direction (X direction); and a second word line extending in the column direction (X direction). Each of the plurality of memory cells contains: a magnetoresistive element; a first transistor; and a second transistor. The magnetoresistive element has a first lower terminal and a second lower terminal which are respectively connected to both ends of a conductive layer whose longitudinal direction is different from the column direction (X direction). In the first transistor, the drain is connected to the first lower terminal and the gate is connected to the first word line. In the second transistor, the drain is connected to the second lower terminal and the gate is connected to the second word line. The gate of the first transistor of each of at least two memory cells among the plurality of memory cells and which are adjacent to each other in the row direction (Y direction) is commonly connected to the first word line.

According to an aspect of the present invention, a manufacturing method of a semiconductor storage device according to the present invention contains: a step of forming a first word line extending in a column direction (X direction); a step of forming a second word line extending in the column direction; and a step of arranging a plurality of memory cells in the column direction (X direction) and a row direction (Y direction) being orthogonal to the row direction. The arranging the plurality of memory cells contains: a step of forming a magnetoresistive element having a conductive layer connected to a first lower terminal and a second lower terminal; a step of forming a first transistor whose drain is connected to the first lower terminal and whose gate is connected to the first word line; and a step of forming a second transistor whose drain is connected to the second lower terminal and whose gate is connected to the second word line. The step of forming the magnetoresistive element contains a step of forming a conductive layer both end of thereof are respectively connected to the first lower terminal and the second lower terminal and a longitudinal direction is different from the column direction (X direction). The gate of the first transistor of each of at least two memory cells among the plurality of memory cells and which are adjacent to each other in the row direction (Y direction) is commonly connected to the first word line.

According to the present invention, without an increase of the cell area, it is possible to reserve the margin in the dimension of the cell structure or in process of the MRAM.

BRIEF DESCRIPTION OF DRAWINGS

FIG. 15 is a circuit diagram showing a partial configuration of the row decoder shown in FIG. 13;

FIG. 30 is a circuit diagram showing a partial configuration of the row decoder shown in FIG. 13.

DESCRIPTION OF EXEMPLARY EMBODIMENTS

Some exemplary embodiment of the present invention will be described below with reference to the accompanying drawings. On the drawings, the same or similar reference symbol indicates the same, similar or equivalent configuration components. Further, when there are a plurality of same or similar configurations and they are discriminated, a branch number is assigned to the same reference number for explanation. In the following exemplary embodiments, for the convenience of an explanation, a configuration and operation of an MRAM which uses a 3-terminal MTJ element of the domain wall displacement type is described as an example.

1. First Exemplary Embodiment

The configuration and operation in a first exemplary embodiment of the MRAM according to the present invention will be described in detail, with reference to FIGS. 7 to 15.

Figure 7:
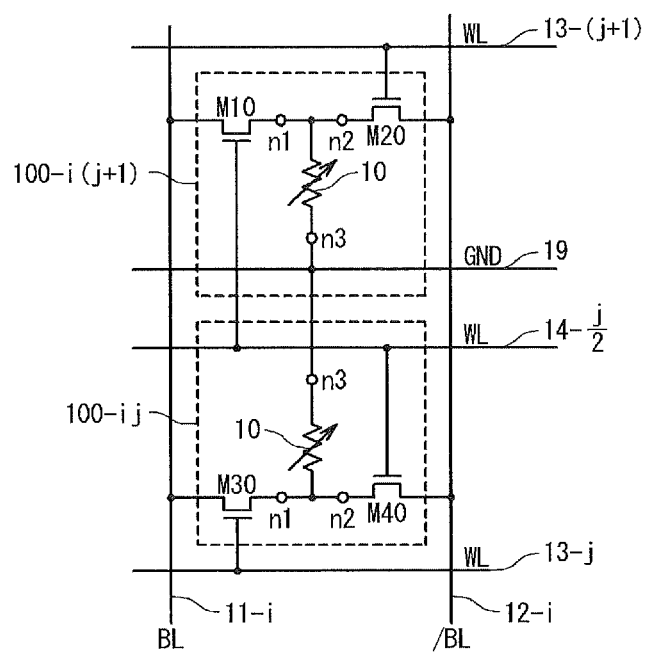
FIG. 7 is a circuit diagram showing a configuration in a first exemplary embodiment of a MRAM cell according to the present invention.

FIG. 7 is a circuit diagram showing a configuration in the first exemplary embodiment of the MRAM cell (memory cell 100) according to the present invention. With reference to FIG. 7, the memory cell 100 in the first exemplary embodiment is the MRAM cell of the so-called 2T1MTJ cell configuration, which contains two transistors M10 and M20 and a 3-terminal MTJ element 10.

The memory cell 100 is used as a memory array (arranged to form an array) arranged in a row direction and a column direction orthogonal to the row direction. The configuration of the memory cell 100, which is arranged on an X-th row, an i-th column in this exemplary embodiment, is described in detail with reference to FIG. 7. Here, a memory cell 100-$ij$ on an even-numbered row (X=j-th row), and a memory cell 100-$i(j+1)$ on an odd-numbered row (X=j+1) are described. Note that, X and i are integers, and j is 0 or a positive even number. In this exemplary embodiment, the memory cell 100-$ij$ on the even-numbered row (X=j-th row) and the memory cell 100-$i(j+1)$ on the odd-numbered row (X=(j+1)-th row) are connected to respective proper word lines 13 and also connected to a common word line 14-($j/2$). The respective configurations will be described below in detail.

The memory cell 100-$i(j+1)$ on an odd-numbered row ((j+1)-th row) contains a transistor M20 connected to the word line 13-($j$+1) proper to the (j+1)-th row, and a transistor M10 connected to the word line 14-($j/2$) and the MTJ element 10. In detail, the gate of the transistor M10 is connected to the word line 14-($j/2$) (WL), and the source is connected to the bit line 11-$i$ (BL), and the drain is connected to the lower terminal n1 of the MTJ element 10. The gate of the transistor M20 is connected to the word line 13-($j$+1) (WL), and the source is connected to the bit line 12-$i$ (/BL), and the drain is connected to the lower terminal n2 of the MTJ element 10. The MTJ elements 10 are variable resistance elements. Each of the MTJ elements 10 contains: the lower terminals n1 and n2 that are connected to the bit lines 11-$i$ (BL) and 12-$i$ (/BL) through the transistors M10 and M20 respectively; and an upper terminal n3 that is grounded to GND through a ground interconnection 19.

The memory cell 100-$ij$ on an even-numbered row (j-th row) contains a transistor M30 connected to the word line 13-$j$ proper to the j-th row, and a transistor M40 connected to the word line 14-($j/2$), and the MTJ element 10. In detail, the gate of the transistor M30 is connected to the word line 13-$j$ (WL), and the source is connected to the bit line 11-$i$ (BL), and the drain is connected to the lower terminal n1 of the MTJ element 10. The gate of the transistor M40 is connected to the word line 14-($j/2$) (WL), and the source is connected to the bit line 12-$i$ (/BL), and the drain is connected to the lower terminal n2 of the MTJ element 10. The MTJ elements 10 are variable resistance elements. Each of the MTJ elements 10 contain: the lower terminals n1 and n2 that are connected to the bit lines 11-$i$ (BL) and 12-$i$ (/BL) through the transistors M30 and M40 respectively; and the upper terminal n3 that is grounded to GND through the ground interconnection 19.

Figure 8:
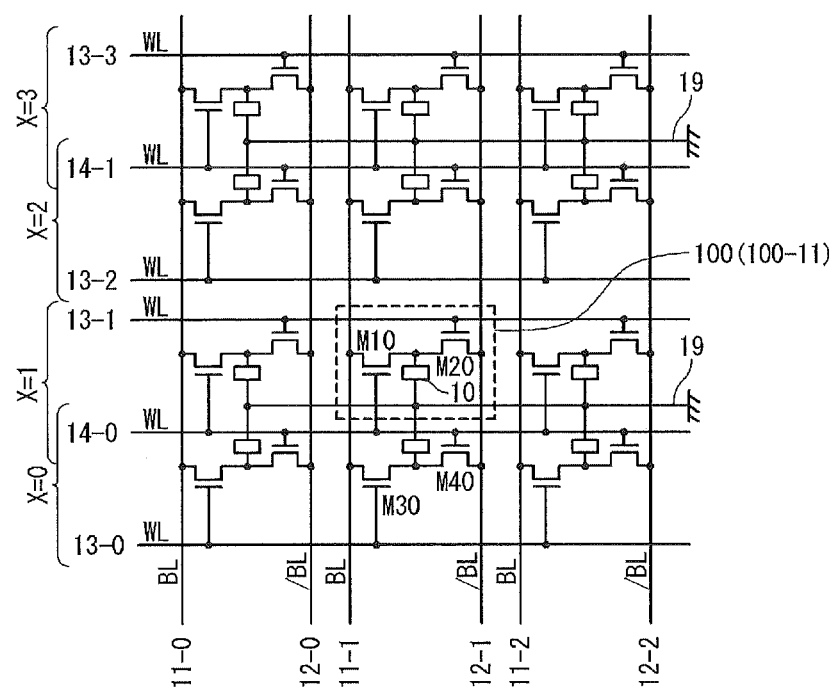
FIG. 8 is a circuit diagram showing a configuration of a memory array in which the memory cells shown in FIG. 7 are arrayed in 4 rows×3 columns.

FIG. 8 is the circuit diagram showing a configuration of a memory array 101 in which the memory cells 100 shown in FIG. 7 are arranged in an array of 4 rows×3 columns. With reference to FIG. 8, in the memory cell 100 on an odd-numbered row in the first exemplary embodiment, a gate terminal of the transistor M10 and a gate terminal of the transistor M20 are connected to the word lines 13 and 14 that are electrically different. For example, in the memory cell 100-$i$1 on the X=1st row, the gate terminal of the transistor M10 is connected to the word line 13-1, and the gate terminal of the transistor M20 is connected to the word line 14-0.

Similarly, in the memory cell 100 on the even-numbered row, the gate terminal of the transistor M30 and the gate terminal of the transistor M40 are connected to the word lines 13 and 14 that are electrically different. For example, in the memory cell 100-$i$0 on the X=0-th row, the gate terminal of the transistor M30 is connected to the word line 13-0, and the gate terminal of the transistor M40 is connected to the word line 14-0. In this way, in this exemplary embodiment, the memory cell 100 on the odd-numbered row and the memory cell 100 on the even-numbered row are connected to the common word line 14. For example, the memory cell 100-$i$1 on an odd-numbered row and the memory cell 100-$i$0 on an even-numbered row adjacent thereto are commonly connected to the word line 14-0.

In the present invention, the memory cells 100-$ij$ and 100-$i$(j+1), which are adjacent to each other on two rows, and commonly connected to the word line 14, are defined as one unit. Then, the units are formed in an array, so that a memory array is consequently configured.

Next, with the structure of the memory cell 100-11 (a memory cell on an odd-numbered row) as an example, the layout structure of the memory cell 100 in this exemplary embodiment will be described below in detail.

Figure 9A:
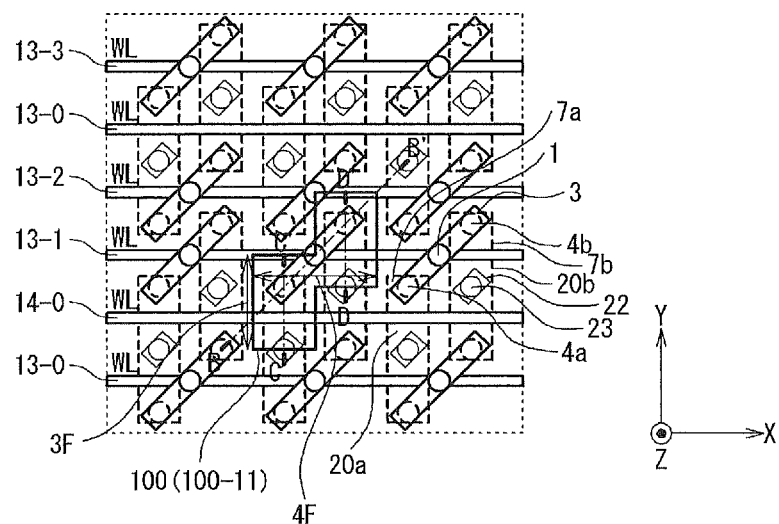
FIG. 9A is a plan view showing an example of a layout structure of the memory array shown in FIG. 8.
Figure 9B:
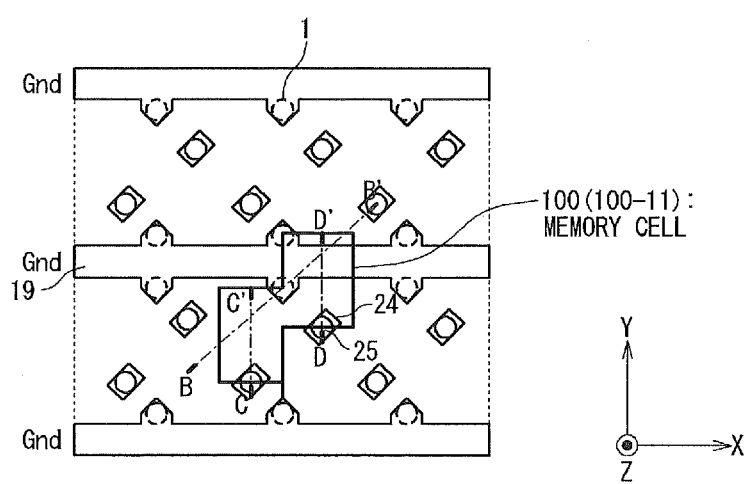
FIG. 9B is a plan view showing an example of the layout structure of the memory array shown in FIG. 8.
Figure 9C:
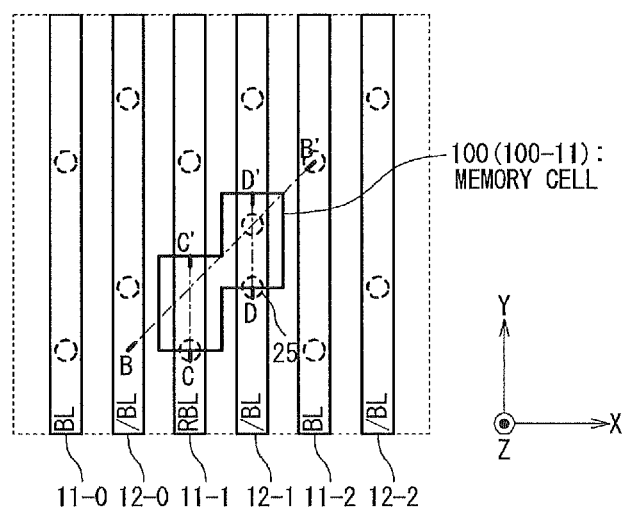
FIG. 9C is a plan view showing an example of the layout structure of the memory array shown in FIG. 8.
Figure 10:
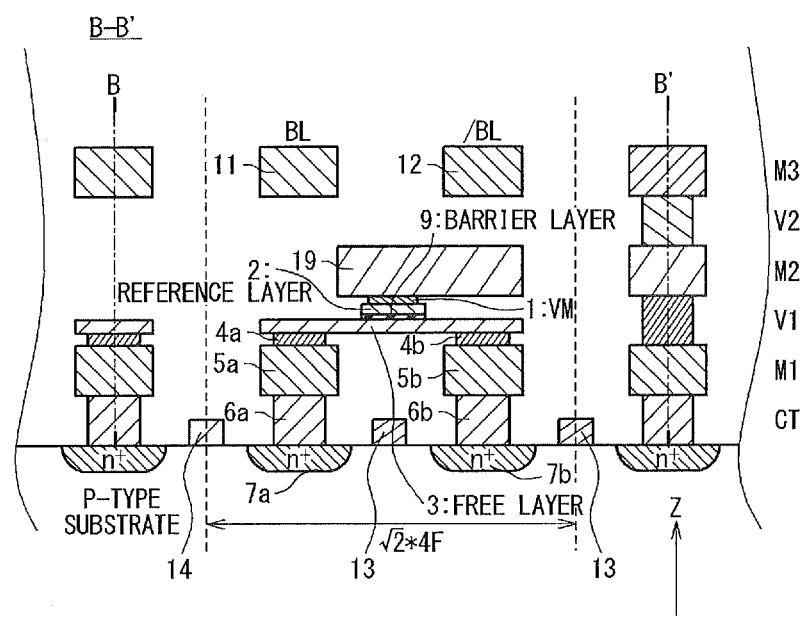
FIG. 10 is a B-B' cross-sectional view in FIGS. 9A to 9C.
Figure 11:
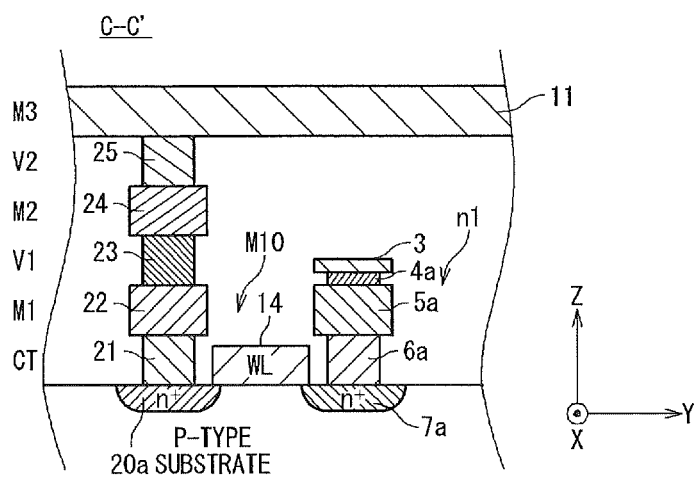
FIG. 11 is a C-C' cross-sectional view in FIGS. 9A to 9C.
Figure 12:
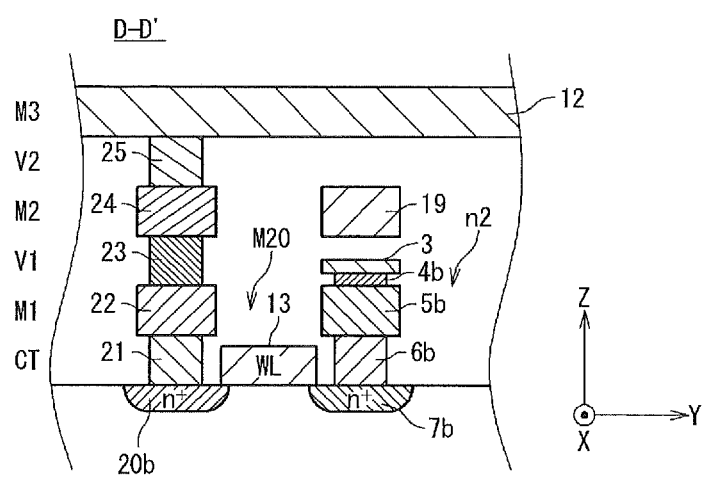
FIG. 12 is a D-D' cross-sectional view in FIGS. 9A to 9C.

FIGS. 9A to 9C are plan views showing the layout structure of the memory array shown in FIG. 8. FIGS. 9A to 9C show plan views of the memory array 101 in which the MTJ element 10 of the domain wall displacement type is used as an example. FIG. 10 is the B-B' cross-sectional view in FIGS. 9A to 9C. FIG. 11 is the C-C' cross-sectional view in FIGS. 9A to 9C. FIG. 12 is the D-D' cross-sectional view in FIGS. 9A to 9C.

FIG. 9A is the plan view showing the structure from the substrate to the MTJ element formation layer (first via formation layer V1) just under the second interconnection layer M2. FIG. 9B is the plan view showing the structure from the second interconnection layer M2 to the second via formation layer V2 just under the third interconnection layer M3. FIG. 9C is the plan view showing the structure of the upper layer from the third interconnection layer.

With reference to FIG. 9A, a free magnetic layer 3 (electrically conductive layer) of the memory cell 100 in this exemplary embodiment is formed to be extending such that its longitudinal direction is at a predetermined angle to the column direction (X direction) in the X-Y plane. In this exemplary embodiment, since the word lines 13 and 14 are formed to be extending in the X direction, the free magnetic layer 3 (electrically conductive layer) is formed to be extending in a direction differing from the extending direction of the word lines 13 and 14. For example, for each memory cell 100, the free magnetic layer 3 is formed to be extending in the direction of 45° with respect to the extension direction of the word lines 13 and 14 in the X-Y plane.

Figure 5A:
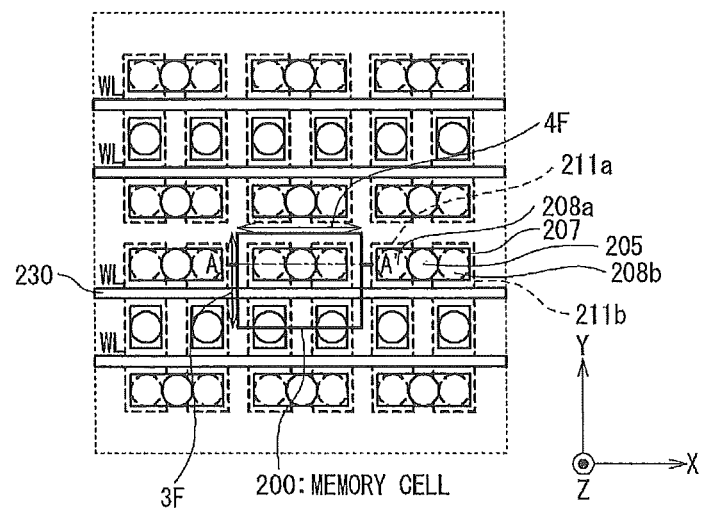
FIG. 5A is a plan view showing the layout structure of the memory array shown in FIG. 4.
Figure 5B:
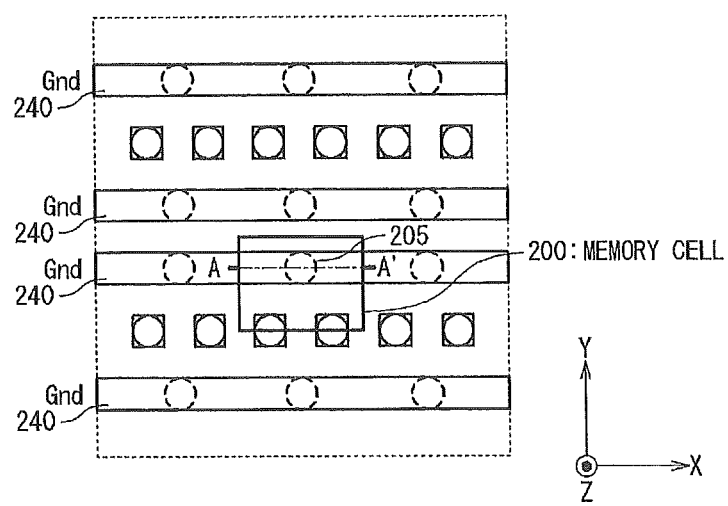
FIG. 5B is a plan view showing the layout structure of the memory array shown in FIG. 4.
Figure 5C:
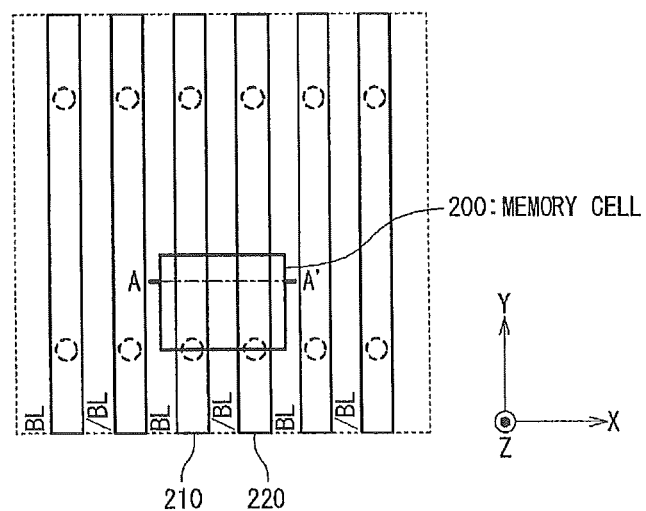
FIG. 5C is a plan view showing the layout structure of the memory array shown in FIG. 4.
Figure 6:
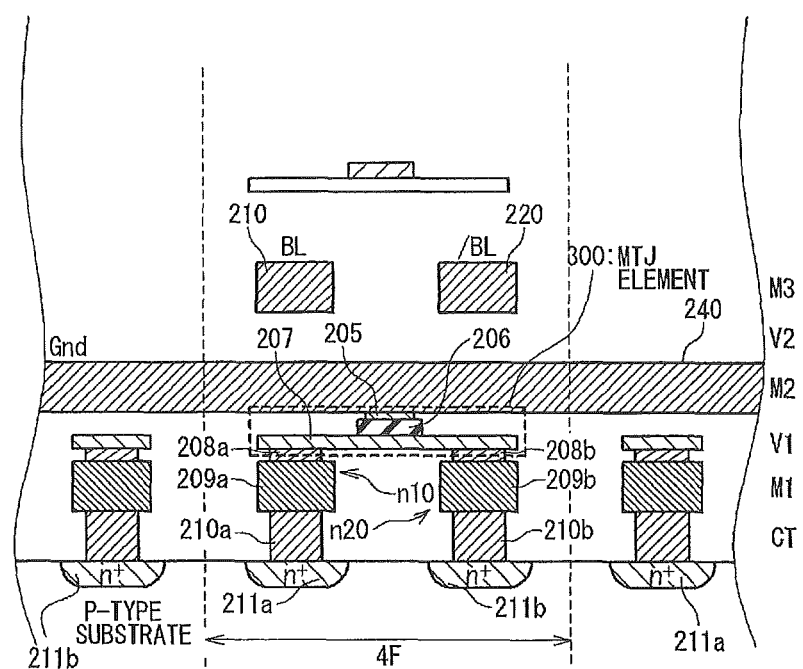
FIG. 6 is an A-A' cross-sectional view in FIGS. 5A to 5C.

With reference to FIGS. 9A and 10, the extension direction (longitudinal direction) of the free magnetic layer 3 is at a predetermined angle θ with respect to the column direction (X direction), and hard layers 4$a$ and 4$b$ connected to the lower terminals n1 and n2 are formed in the lower layers close to both ends thereof. Assuming that the distance in the X direction between the hard layers 4$a$ and 4$b$ is L, the distance between the hard layers 4$a$ and 4$b$ along the free magnetic layer 3 becomes L/cos θ. For example, in a case of θ=45°, the distance between the hard layers 4$a$ and 4$b$ along the free magnetic layer 3 becomes $2^{(1/2)} \times L$. In this case, a dimension that can be used as the long side of the free magnetic layer 3 can be increased to $2^{(1/2)}$ times, as compared with the layouts shown in FIGS. 5A to 5C. That is, a distance between the lower terminals n1 and n2 of the MTJ element 300 shown in FIGS. 5A to 5C is a length based on a width "4 F" of the memory cell 200. However, the distance between the lower terminals n1 and n2 in this exemplary embodiment is the length based on "$2^{(1/2)} \times 4$ F", and the distance becomes longer by about 1.41 times, as compared with the conventional distance.

The structure of the MTJ element 10 in this exemplary embodiment will be described below with reference to FIG. 10. In this example, it is assumed that the MRAM layer (MTJ element 10) is formed between the first interconnection layer M1 and the second interconnection layer M2. On an N+ diffusion layer 7$a$ formed on the P-type substrate, a contact 6$a$ forming the lower terminal n1 and a metal interconnection 5$a$ are laminated in turn, and the hard layer 4$a$ is formed in its upper layer. Further, on an N+ diffusion layer 7$b$ formed on the P-type substrate, a contact 6$b$ forming the lower terminal n2 and a metal interconnection 5$b$ are laminated in turn, and the hard layer 4$b$ is formed in its upper layer. The free magnetic layer 3 is formed in the upper layer of the hard layers 4$a$ and 4$b$, and a barrier layer 9 and a reference layer 2 are formed in the upper layer of the free magnetic layer 3 on which the hard layers 4$a$ and 4$b$ are not formed in the lower layer. The distance between the hard layers 4$a$ and 4$b$ is the maximum of "$2^{(1/2)} \times 4$ F". The barrier layer 9 and the reference layer 2 are formed on the free magnetic layer 3 in this zone. The reference layer 2 is connected through a via 1 to the ground interconnection 19.

With reference to FIG. 9B, the ground interconnection 19 is formed to be extending in the column direction (X direction) and connected to the memory cells 100 on the two rows adjacent to each other in the row direction (Y direction) in which the word line 14 is not shared. Consequently, it is possible to reduce the number of the ground interconnections 19 through which one end (the terminal n3) of the MTJ element 10 inside the memory cell 100 is grounded. Further, with reference to FIGS. 10 and 9C, the bit lines 11 (BL) and 12 (/BL) are formed to be extending in the row direction (Y direction) in the third interconnection layer M3 in the upper layer of the ground interconnection 19.

The structure of the transistor M10 in this exemplary embodiment will be described below with reference to FIGS. 9A to 9C and FIG. 11. The transistor M10 contains the word line 14 functioning as the gate, an N+ diffusion layer 20$a$ functioning as the source, and the N+ diffusion layer 7$a$ functioning as the drain. The N+ diffusion layer 20$a$ is formed in the P-type substrate at a position that is separated at a predetermined interval in the negative orientation of the Y direction with respect to the N+ diffusion layer 7$a$. The word line 14 is formed to be extending in the column direction (X direction) on the P-type substrate between the N+ diffusion layers 7$a$ and 20$a$. The N+ diffusion layer 20$a$ is connected to the bit line 11 (BL) through a contact 21, a metal interconnection 22, a via 23, a metal interconnection 24 and a via 25, which are laminated in turn from the lower layer. The N+ diffusion layer 7$a$ is connected to the lower terminal n1 of the MTJ element 10. With the above configuration, the gate of the transistor M10 is connected to the word line 14 that is common with the other memory cells 100, and the source is connected to the bit line 11, and the drain is connected to the lower terminal n1 of the MTJ element 10. The bit line 11 (BL) is formed to be extending in the row direction (Y direction). Thus, the memory cells 100 on the same column are connected to the common bit line 11.

The structure of the transistor M20 in this exemplary embodiment will be described below with reference to FIGS. 9A to 9C and FIG. 12. The transistor M20 contains the word line 13 functioning as the gate, an N+ diffusion layer 20$b$ functioning as the source, and the N+ diffusion layer 7b functioning as the drain. The N+ diffusion layer 20b is formed in the P-type substrate at a position that is separated at a predetermined interval in the negative orientation of the Y direction with respect to the N+ diffusion layer 7b. The word line 13 is formed to be extending in the column direction (X direction) on the P-type substrate between the N+ diffusion layers 7b and 20b. The N+ diffusion layer 20b is connected to the bit line 12 (/BL) through the contact 21, the metal interconnection 22, the via 23, the metal interconnection 24 and the via 25, which are laminated in turn from the lower layer. The N+ diffusion layer 7b is connected to the lower terminal n2 of the MTJ element 10. With the above configuration, the gate of the transistor M20 is connected to the word line 13, and the source is connected to the bit line 12, and the drain is connected to the lower terminal n2 of the MTJ element 10. Since the bit line 12 (/BL) is formed to be extending in the row direction (Y direction), the memory cells 100 on the same column are connected to the common bit line 12.

As explained above, in the memory cell 100 in this exemplary embodiment, the longitudinal direction of the free magnetic layer 3 is at a certain angle with respect to the column direction (X direction), and the MOS transistors M10 and M20 whose channel directions are the row direction (the negative orientation of the Y direction) are formed to the lower terminals n1 and n2 placed at both ends of the free magnetic layer 3, respectively. For this reason, for example, the memory cell 100-11 has the shape in which a rectangle (cell size 2 F×3 F), which contains the word line 14-0 and the bit line 11-1, and a rectangle (cell size 2 F×3 F), which contains the word line 13-1 and the bit line 12-1 are combined. That is, the minimum cell size of the memory cell 100 becomes "12 $F^2$", and the overhead of the cell area becomes zero. Further, in the present invention, the longitudinal direction of the free magnetic layer 3 is at a predetermined angle θ with respect to the column direction (X direction). Thus, the distance between the hard layers 4a and 4b (between the lower terminals n1 and n2) can be made longer than a conventional distance, by 1/cos θ times. For example, in a case of θ=45°, the distance between the hard layers 4a and 4b (between the lower terminals n1 and n2) can be made longer than the conventional distance, by 1.41 times. This means that the distance between the hard layers 4a and 4b and the reference layer 2 can be reserved at the maximum of about 0.4 F. From the above, according to the present invention, while reserving the dimension of the MRAM layer (the MTJ element 10) and a process margin, it is possible to attain the cell size "12 $F^2$" that is the minimum area.

In this exemplary embodiment, the ideal minimum area of the memory cell 100 that is minimized in accordance with the design rule is 12 $F^2$. Thus, the bit cost becomes 1.5 times as compared with the 1T1MTJ cell configuration. However, for the distance between the hard layers 4a and 4b and the end of the reference layer 2 (the distance of the longitudinal direction of the free magnetic layer 3), it is possible to reserve the maximum of about 0.4 F (θ=45°. For this reason, it does not become the half selection state, so that it is possible to select only the memory cell being the writing or reading target of data accurately. Further, by increasing the distance between the hard layers 4a and 4b and the end of the free magnetic layer 3, it is possible to reduce the writing current to 1 mA or less and simplify peripheral circuits. Thus, according to the present invention, the cell occupation rate in the MRAM can be increased similarly to the DRAM. As a result, a large memory capacity can be achieved.

In the above explanations, among the memory cells 100 commonly connected to the word lines 14, the structure of the memory cells 100-(ij+1) (100-i1, 100-i3, - - - ) on the odd-numbered rows located on the positive side of the Y direction with respect to the word line 14 is described. However, the structure of the memory cells 100-ij (100-i0, 100-i2, - - - ) on the even-numbered rows located on the negative side of the Y direction is also similar. The structures of the memory cell 100-ij on the even-numbered row and the memory cell 100-i(j+1) on the odd-numbered row indicate a rotational symmetric structure to each other in which in the X-Y plane, one is rotated by 180° with one point on the word line 14 shared by the respective memory cells as the axis. Further, the word line 14-(j/2) commonly connected to the two memory cells 100-(ij+1) and 100-ij adjacent to each other in the column direction (Y direction) is formed between the word line 13-(j+1) and the word line 13-j that are properly connected to the two memory cells 100-(ij+1) and 100-ij, respectively.

With the above structure, the memory array 101 according to the present invention contains a plurality of memory cell groups, and each of the memory cell groups contains two rows which shares the word line 14 and connected to different word lines 13 respectively.

The on and off action of the transistors M10 and M20 in each memory cell 100 are controlled by signals supplied to the different word lines 13 and 14, respectively. For this reason, the memory cell 100 targeted for writing or reading the data is selected by a control method different from conventional methods. Further, since the word lines 14 are commonly connected to the memory cell 100 for each two rows, the number of the word lines can be substantially set to 1.5, though in usual cases, two word lines are required for one memory cell. That is, in the present invention, when the number of the rows of the memory array 101 is n, the number of the word lines becomes 1.5×n.

Figure 13:
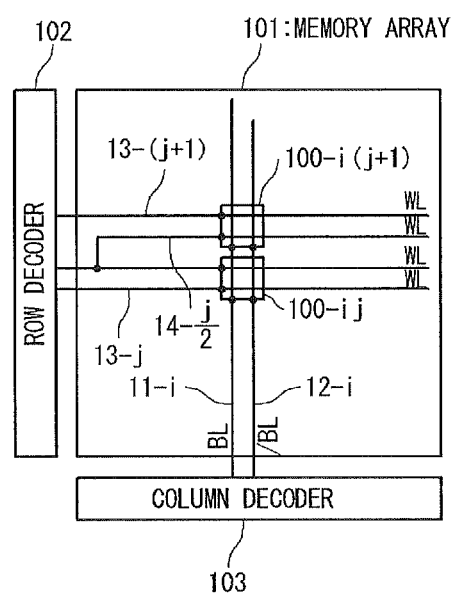
FIG. 13 is a block diagram showing a configuration in the first exemplary embodiment of a semiconductor storage device in which an MRAM according to the present invention is mounted.

The configuration and operation in the first exemplary embodiment of the semiconductor storage device in which the MRAM according to the present invention is mounted will be described in detail below with reference to FIGS. 13 to 15. FIG. 13 is the block diagram showing the configuration in the first exemplary embodiment of the semiconductor storage device in which the MRAM according to the present invention is mounted.

With reference to FIG. 13, the semiconductor storage device in the first exemplary embodiment contains a memory array 101, a row decoder 102 and a column decoder 103. The row decoder 102 outputs control signals to the word lines 13 and 14 (WL) and controls the on/off operations of the transistors M10 and M20 connected to the word lines 13 and 14. Consequently, the row address of an access target memory cell (selected cell) is specified. The column decoder 103 outputs a signal corresponding to the data to be recorded in the MRAM to the bit lines 11 and 12. Consequently, the column address of the access target memory cell (selected cell) is specified.

As explained above, the word line 14-(j/2) is shared by the memory cell 100-ij and the memory cell 100-i(j+1) adjacent to each other in the row direction. The word lines 13-j and 13-(j+1) serve as the word lines dedicated to the memory cells 100-ij and 100-i(j+1), respectively.

Figure 14:
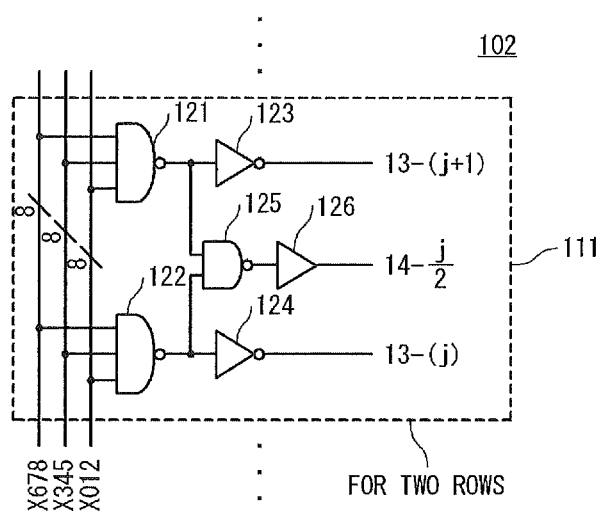
FIG. 14 is a circuit diagram showing a partial configuration of a row decoder shown in FIG. 13.

FIG. 14 is the circuit diagram showing a partial configuration of the row decoder shown in FIG. 13. Here, as an example, a decoder circuit for driving the word lines 13-j, 14-(j/2) and 13-(j+1) corresponding to two rows is represented. With reference to FIG. 14, the row decoder 102 contains a logic circuit 111 for driving the word lines of two rows correspondingly to the address signals "X012", "X345" and "X678" each having 8 bits. The logic circuit 111 contains NAND circuits 121, 122, and 125, NOT circuits 123 and 124 and a buffer 126. The signal of the lower (j+1)-th bit corresponding to the row address X=j in each of the 8-bit address signals "X012", "X345" and "X678" is selectively inputted to the NAND circuit 122. The NAND circuit 122 outputs the NAND calculation result of the input signal through the NOT circuit 124 to the word line 13-j. Similarly, the signal of the lower (j+2)-th bit corresponding to the row address X=j+1 in each of the 8-bit address signals "X012", "X345" and "X678" is selectively inputted to the NAND circuit 121. The NAND circuit 121 outputs the NAND calculation result of the input signal through the NOT circuit 123 to the word line 13-(j+1).

The outputs of the NAND circuits 121 and 122 are inputted to the NAND circuit 125, and its NAND calculation result is outputted through the buffer 126 to the word line 14-(j/2). That is, the OR calculation result of the signal of lower (j+1)-th bit and the signal of lower (j+2)-th bit in each of the 8-bit address signals "X012", "X345" and "X678" is outputted to the word line 14-(j/2). Consequently, the word line 14-(j/2) is activated when at least one of the word lines 13-j and 13-(j+1) is activated (it becomes the high level).

As an example, an operation of the logic circuit 111 (j=0) for driving the memory cells 100-i0 and 100-i1 of one row in a row address X=0 is described. The NAND circuit 122 outputs the NAND calculation result of the decoding signal of the lower first bit in each of the address signals "X012", "X345" and "X678" to the NOT circuit 124 and the NAND circuit 125. Similarly, the NAND circuit 121 outputs the NAND calculation result of the decoding signal on the lower second bit in each of the address signals "X012", "X345" and "X678", to the NAND circuit 125 and the NOT circuit 124. The NAND circuit 125 outputs the NAND calculation result of the input signal through the buffer 126 to the word line 14-0. Further, the NOT circuit 123 outputs the inversion signal of the input signal from the NAND circuit 121 to the word line 13-1. Moreover, the NOT circuit 124 outputs the inversion signal of the input signal from the NAND circuit 122 to the word line 13-0.

FIG. 15 is an example of a truth table that indicates the operation of the row decoder 102 shown in FIG. 13. FIG. 15 shows the truth table that indicates the word lines 13 and 14 activated correspondingly to the selected row address "X". As mentioned above, when the memory cell 100-ij on the even-numbered row (X=j-th row) is selected, the row decoder 102 sets only the word line 13-j and the word line 14-(j/2) to the high level, and sets the other word lines 13 and 14 to the low level. Also, when the memory cell 100-i(j+1) on the odd-numbered row (X=(j+1)-th row) is selected, the row decoder 102 sets only the word line 13-(j+1) and the word line 14-(j/2) to the high level, and sets the other word lines 13 and 14 to the low level. Therefore, as shown in FIG. 15, when the row address "X=j" is selected, the adjacent word lines 13-j and 14-(j/2) are activated, and when the row address "X=j+1" is selected, the adjacent word lines 13-(j+1) and 14-(j/2) are activated. For example, when (the memory cell 100-i0) on the row address "X=0(j=0)" is selected, the row decoder 102 sets the word line 13-0 and the word line 14-0 to the high level and sets all of the other word lines 13 and 14 to the low level. Similarly, when the row address "X=1 (j+1=1)" (memory cell 100-i1) is selected, the row decoder 102 sets the word line 14-0 and the word line 13-1 to the high level and sets all of the other word lines 13 and 14 to the low level.

Except that the selecting method of the row address is different, the method for accessing the memory cell 100 is similar to the MRAM of the conventional 2T1MTJ cell base. For example, when a data is written to the memory cell 100-ij on the even numbered row (j-th row), i-th column, in a state in which the word lines 13-j and 14-(j/2) are set to the high level, the complementary voltage corresponding to the writing information is applied to the bit lines 11-i and 12-i. For example, when the data is written to the memory cell 100-10 on the 0-th row, first column (i=1, j=0), in a state in which the word lines 13-0 and 14-0 are set to the high level, the complementary voltage corresponding to the writing information is applied to the bit lines 11-1 and 12-1. All of the other non-selected word lines and non-selected bit lines are set to the low level. Consequently, the writing current is supplied to the selected cells. Then, the magnetization in the free magnetic layer 3 of the MTJ element 10 is inverted, thereby rewriting the information in the memory cell 100. Also, when the data is written to the memory cell 100-i(j+1) on the odd-numbered row ((j+1)-th row), i-th column, in a state in which the word line 13-(j+1), 14-(j/2) are set to the high level, the complementary voltage corresponding to the writing information is applied to the bit lines 11-i and 12-i. For example, when the data is written to the memory cell 100-11 on the first row, first column (i=1, j=1), in a state in which the word lines 13-1, 14-0 are set to the high level, the complementary voltage corresponding to the writing information is applied to the bit lines 11-1 and 12-1. All of the other non-selected word lines and non-selected bit lines are set to the low level.

On the other hand, when the data stored in the memory cell 100-ij on the even numbered row (j-th row), i-th column is read, in a state in which the word lines 13-j and 14-(j/2) are set to the high level, a voltage Vc of about 0.3V is applied to the bit lines 11-i and 12-i. At this time, by detecting the sense current Is flowing through the MTJ element 10 in the memory cell 100-ij, the information in the memory cell 100-ij can be read out. For example, in a state in which the word lines 13-0 and 14-0 are set to the high level, by applying the voltage Vc of about 0.3V to the bit lines 11-1 and 12-1 and detecting the sense current Is flowing through the MTJ element in the memory cell 100-10, the data recorded in the memory cell 100-10 can be read out. Also, when the data stored in the memory cell 100-i(j+1) on the odd-numbered row (j+1)-th row, i-th column is read, in a state in which the word lines 13-(j+1) and 14-(j/2) are set to the high level, the voltage Vc of about 0.3V is applied to the bit lines 11-i and 12-i. At this time, by detecting the sense current Is flowing through the MTJ element 10 in the memory cell 100-i(j+1), the information inside the memory cell 100-i(j+1) can be read out. For example, in a state in which the word lines 13-1 and 14-0 are set to the high level, by applying the voltage Vc of about 0.3V to the bit lines 11-1 and 12-1 and detecting the sense current Is flowing through the MTJ element in the memory cell 100-11, the data recorded in the memory cell 100-11 can be read out.

2. Second Exemplary Embodiment

The configuration and operation in the second exemplary embodiment of the MRAM according to the present invention will be described below in detail with reference to FIGS. 16 to 21. A difference from the first exemplary embodiment lies in a fact that the bit lines (BL, /BL) are separated for reading and writing and the upper terminal n3 of the MTJ element 10 is connected to a read bit line (RBL) without being grounded. The other points are similar to the first exemplary embodiment. Hereafter, the portions differing from the first exemplary embodiment are mainly described.

Figure 16:
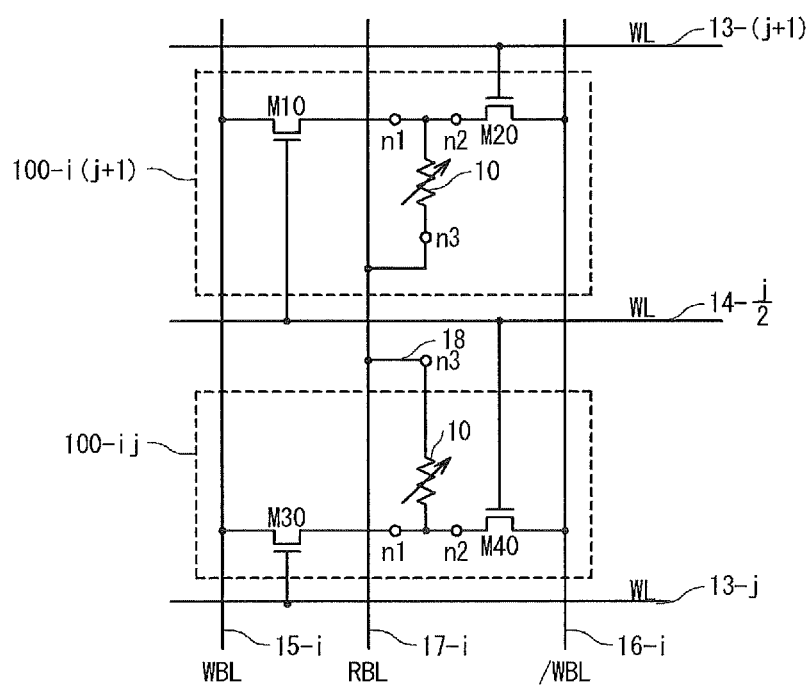
FIG. 16 is a circuit diagram showing a configuration in a second exemplary embodiment of the MRAM cell according to the present invention.

FIG. 16 is a circuit diagram showing the configuration in the second exemplary embodiment of the MRAM cell (memory cell 100) according to the present invention. With reference to FIG. 16, the memory cell 100 in the second exemplary embodiment is the MRAM cell of the so-called 2T1MTJ cell configuration that contains two transistors M10 and M20 and a 3-terminal MTJ element 10.

The configuration of the memory cell 100 on the X-th row, i-th column in this exemplary embodiment will be described below with reference to FIG. 16. Here, the memory cell 100-*ij* on the even-numbered row (X=j-th row), and the memory cell 100-*i*(j+1) on the odd-numbered row (X=j+1) are described. Note that, X and i are the integers, and j is 0 or a positive even number. In this exemplary embodiment, the memory cell 100-*ij* on the even-numbered row (X=j-th row) and the memory cell 100-*i*(j+1) on the odd-numbered row (X=(j+1)-th row) are connected to the respective proper word lines 13 and also connected to the common word line 14-(*j*/2). The respective configurations will be described below in detail.

The memory cell 100-*i*(j+1) on the odd-numbered row ((j+1)-th row) contains the transistor M20 connected to the word line 13-(*j*+1) proper to the (j+1)-th row, and the transistor M10 connected to the word line 14-(*j*/2) and the MTJ element 10. In detail, the gate of the transistor M10 is connected to the word line 14-(*j*/2) (WL), and the source thereof is connected to the bit line 15-*i* (WBL) for writing, and the drain thereof is connected to the lower terminal n1 of the MTJ element 10. The gate of the transistor M20 is connected to the word line 13-(*j*+1) (WL), the source thereof is connected to the bit line 16 (/WBL) for writing, and the drain thereof is connected to the lower terminal n2 of the MTJ element 10. The MTJ elements 10 are the variable resistance elements. Each of the MTJ elements 10 contains: the lower terminals n1 and n2 that are connected to the bit lines 15-*i* (WBL) and 16-*i* (/WBL) through the transistors M10 and M20 respectively; and the upper terminal n3 that is connected to the bit line 17-*i* for reading.

The memory cell 100-*ij* on the even-numbered row (j-th row) contains the transistor M30 connected to the word line 13-*j* proper to the j-th row, the transistor M40 connected to the word line 14-(*j*/2), and the MTJ element 10. In detail, the gate of the transistor M30 is connected to the word line 13-*j* (WL), and the source thereof is connected to the bit line 15-*i* (WBL) for writing, and the drain thereof is connected to the lower terminal n1 of the MTJ element 10. The gate of the transistor M40 is connected to the word line 14-(*j*/2) (WL), and the source thereof is connected to a bit line 16-*i* (/WBL) for writing, and the drain thereof is connected to the lower terminal n2 of the MTJ element 10. The MTJ elements 10 are the variable resistance elements. Each of the MTJ elements 10 contains: the lower terminals n1 and n2 that are connected to the bit lines 15-*i* (WBL) and 16-*i* (/WBL) through the transistors M30 and M40 respectively; and the upper terminal n3 that is connected to the bit line 17-*i* (RBL) for reading.

Figure 17:
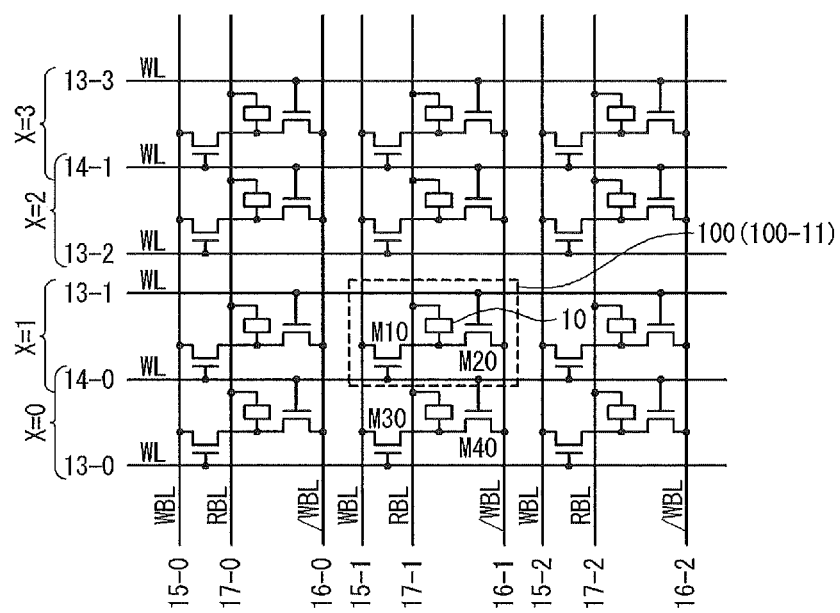
FIG. 17 is a circuit diagram showing a configuration of a memory array in which the memory cells shown in FIG. 16 are arrayed in 4 rows×3 columns.

FIG. 17 is a circuit diagram showing the configuration of the memory array 101 in which the memory cells 100 shown in FIG. 16 are arrayed in 4 rows×3 columns. With reference to FIG. 17, in the second exemplary embodiment, the memory cells 100 on the same i-th column are connected to the same bit lines 15-*i* and 16-*i* for writing and the bit line 17-*i* for reading. The other configurations (for example, the word line to which the memory cell is connected) are identical to the first exemplary embodiment.

Similarly to the first exemplary embodiment, the MRAM in the second exemplary embodiment configures the memory array in which the memory cells 100-*ij* and 100-*i*(j+1) on two rows, which are adjacent to each other and commonly connected to the word line 14, form one unit, and the units are formed to be array.

With the structure of the memory cell 100-11 as an example, the layout structure of the memory cell 100 in this exemplary embodiment will be described below in detail.

Figure 19:
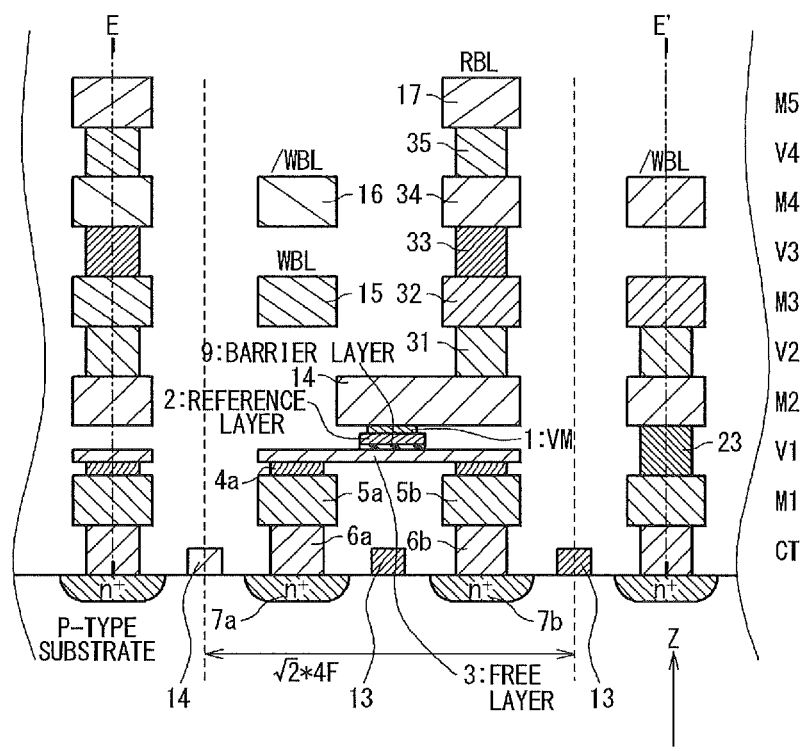
FIG. 19 is an E-E' cross-sectional view in FIGS. 18A to 18E.
Figure 20:
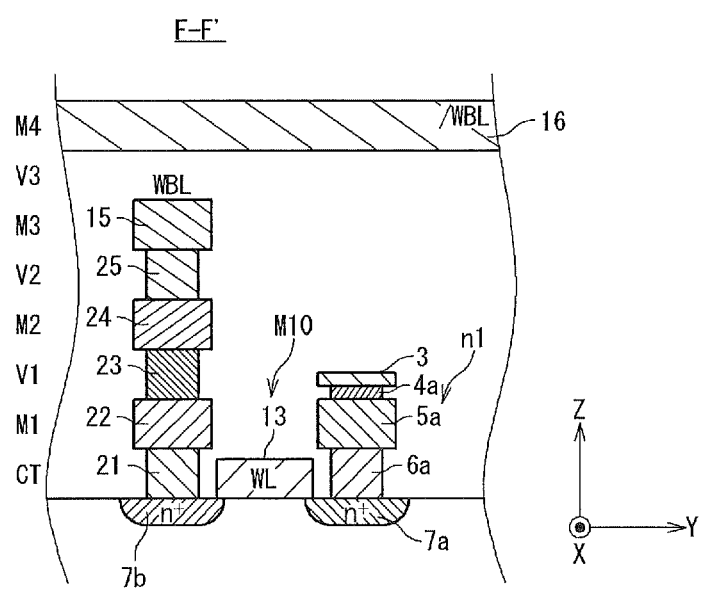
FIG. 20 is an F-F' cross-sectional view in FIGS. 18A to 18E.
Figure 21:
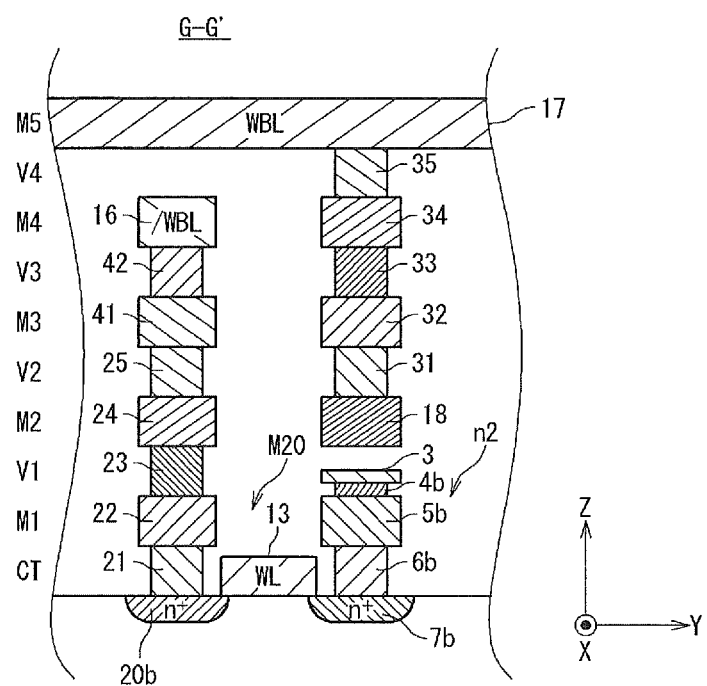
FIG. 21 is a G-G' cross-sectional view in FIGS. 18A to 18E.

FIGS. 18A to 18E are plan views showing the layout structure of the memory array shown in FIG. 17. FIGS. 18A to 18E show the plan view of the memory array 101 in which the MTJ element 10 of the domain wall displacement type is used as an example. FIG. 19 is the E-E' cross-sectional view in FIGS. 18A to 18E. FIG. 20 is the F-F' cross-sectional view in FIGS. 18A to 18E. FIG. 21 is the G-G' cross-sectional view in FIGS. 18A to 18E.

Figure 18A:
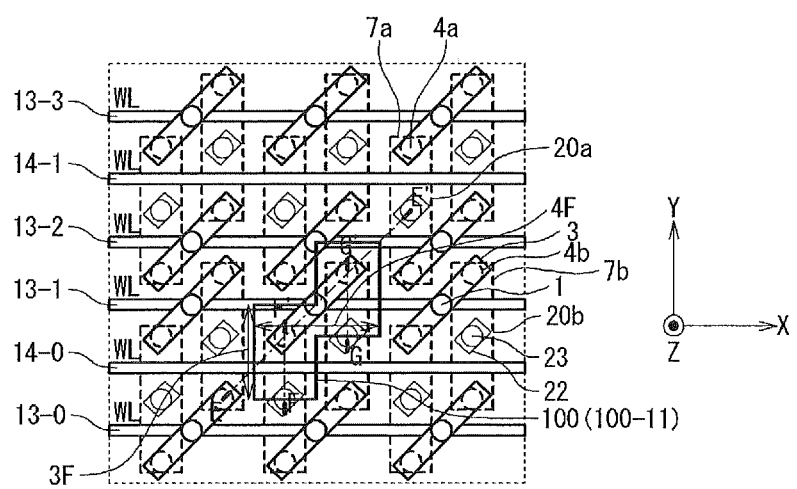
FIG. 18A is a plan view showing an example of a layout structure of the memory array shown in FIG. 17.
Figure 18B:
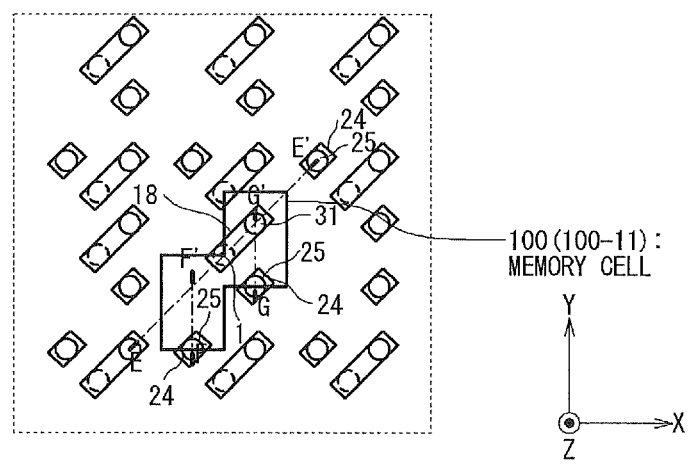
FIG. 18B is a plan view showing an example of the layout structure of the memory array shown in FIG. 17.
Figure 18C:
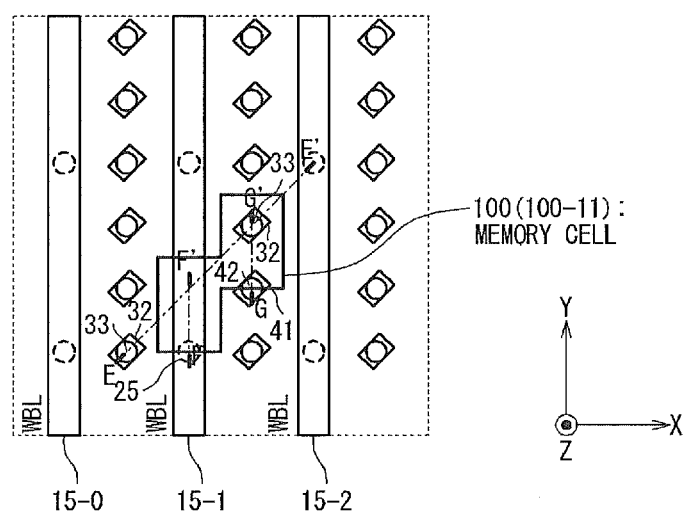
FIG. 18C is a plan view showing an example of the layout structure of the memory array shown in FIG. 17.
Figure 18D:
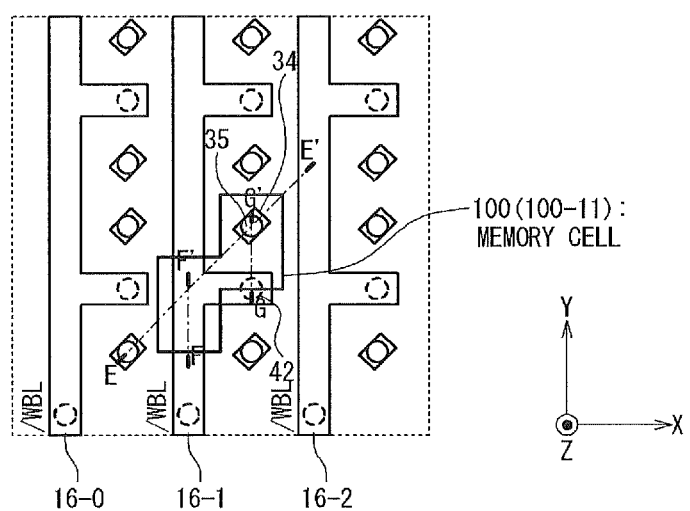
FIG. 18D is a plan view showing an example of the layout structure of the memory array shown in FIG. 17.
Figure 18E:
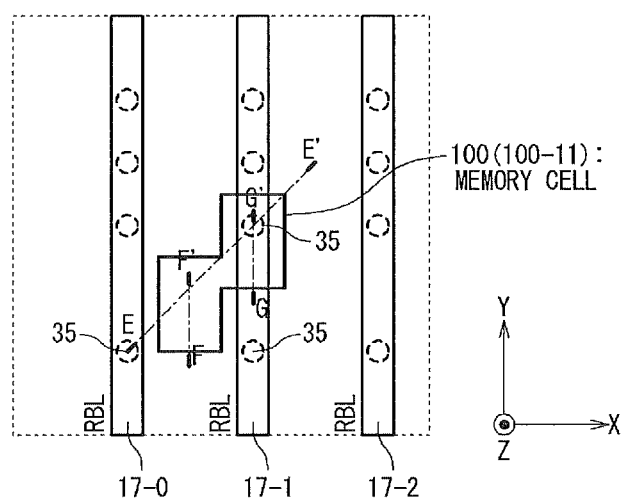
FIG. 18E is a plan view showing an example of the layout structure of the memory array shown in FIG. 17.

FIG. 18A is the plan view showing the structure from the substrate to the MTJ element formation layer (first via formation layer V1) just under the second interconnection layer M2. FIG. 18B is the plan view showing the structure from the second interconnection layer M2 to the second via formation layer V2 just under the third interconnection layer M3. FIG. 18C is the plan view showing the structure from the third interconnection layer M3 to the third via formation layer V3 just under a fourth interconnection layer M4. FIG. 18D is the plan view showing the structure from the fourth interconnection layer M4 to a fourth via formation layer V4 just under a fifth interconnection layer M5. FIG. 18E is the plan view showing the structure of the upper layer from the fifth interconnection layer.

With reference to FIG. 18A, the free magnetic layer 3 of the memory cell 100 in this exemplary embodiment is formed to be extended whose longitudinal direction is at a predetermined angle with respect to the column direction (X direction) in the X-Y plane, similarly to the first exemplary embodiment. In this exemplary embodiment, since the word lines 13 and 14 are formed to be extending in the X direction, the free magnetic layer 3 is formed to be extending in the direction different from the extension direction of the word lines 13 and 14. For example, for each memory cell 100, the free magnetic layer 3 is formed to be extending at the direction of 45° to the extension direction of the word lines 13 and 14 in the X-Y plane.

With reference to FIGS. 18A and 19, the extension direction (longitudinal direction) of the free magnetic layer 3 is at a predetermined angle θ with respect to the column direction (X direction), and the hard layers 4a and 4b connected to the lower terminals n1 and n2 are formed in the lower layers close to both ends thereof. Assuming that the distance of the X direction between the hard layers 4a and 4b is L, the distance between the hard layers 4a and 4b along the free magnetic layer 3 is L/cos θ. For example, in the case of θ=45°, the distance between the hard layers 4a and 4b along the free magnetic layer 3 is $2^{(1/2)} \times L$. In this case, the dimension that can be used as the long side of the free magnetic layer 3 can be increased to $2^{(1/2)}$ times, as compared with the layouts shown in FIGS. 5A to 5C. That is, the distance between the lower terminals n10 and n20 of the MTJ element 300 shown in FIGS. 5A to 5C is the length corresponding to the width "4 F" of the memory cell 200. However, the distance between the lower terminals n1 and n2 in this exemplary embodiment is the length corresponding to "$2^{(1/2)} \times 4$ F", and the distance becomes longer by about 1.41 times, as compared with the conventional case.

The structure of the MTJ element 10 in this exemplary embodiment will be described below with reference FIG. 19. This example is assumed such that the MRAM layer (MTJ element 10) is formed between the first interconnection layer M1 and the second interconnection layer M2. The structure from the P-type substrate to the magnetic resistance formation layer in the lower layer of the second interconnection layer M2 is similar to the first exemplary embodiment, so that its description is omitted. The reference layer 2 in this exemplary embodiment is connected through a via 1 to a metal interconnection 18 that is formed to be extending in the same direction as the longitudinal direction f the free magnetic layer 3. The metal interconnection 18 is connected to the bit line 17 (RBL) for reading, which is formed in the fifth interconnection layer M5, through a via 31, a metal interconnection 32 formed in the third interconnection layer M3, a via 33, a metal interconnection 34 formed in the fourth interconnection layer M4 and a via 35.

The structure of the transistor M10 in this exemplary embodiment will be described below with reference to FIGS. 18A to 18E and FIG. 20. The transistor M10 contains the word line 14 functioning as the gate, the N+ diffusion layer 20a functioning as the source, and the N+ diffusion layer 7a functioning as the drain. The N+ diffusion layer 20a is formed in the P-type substrate at the position that is separated at a predetermined interval in a predetermined orientation (here, the negative orientation) of the Y direction with respect to the N+ diffusion layer 7a. The word line 14 is formed to be extending in the column direction (X direction) on the P-type substrate between the N+ diffusion layers 7a and 20a. The N+ diffusion layer 20a is connected to the bit line 15 (WBL) for writing, through the contact 21, the metal interconnection 22, the via 23, the metal interconnection 24 and the via 25, which are laminated in turn from the lower layer. Further, the N+ diffusion layer 7a is connected to the lower terminal n1 of the MTJ element 10. With the above configuration, the gate of the transistor M10 is connected to the word line 14 that is common with the other memory cells 100, and the source is connected to the bit line 15, and the drain is connected to the lower terminal n1 of the MTJ element 10. Further, the bit line 15 (WBL) is formed to be extending in the row direction (Y direction). Thus, the memory cells 100 on the same column are connected to the common bit line 15. Moreover, the bit line 16 (/WBL) for writing, which is formed to be extending in the row direction (Y direction), is formed in the fourth interconnection layer M4 in the upper layer of the bit line 15.

The structure of the transistor M20 in this exemplary embodiment will be described be low with reference to FIGS. 18A to 18E and FIG. 21. The transistor M20 contains the word line 13 functioning as the gate, the N+ diffusion layer 20b functioning as the source, and the N+ diffusion layer 7b functioning as the drain. The N+ diffusion layer 20b is formed in the P-type substrate at the position that is separated at a predetermined interval in a predetermined orientation (here, the negative orientation) of the Y direction with respect to the N+ diffusion layer 7b. The word line 13 is formed to be extending in the column direction (X direction) on the P-type substrate between the N+ diffusion layers 7b and 20b. The N+ diffusion layer 20b is connected to the bit line 16 (/WBL) for writing, through the contact 21, the metal interconnection 22, the via 23, the metal interconnection 24 and the via 25, a metal interconnection 41 and a via 42, which are laminated in turn from the lower layer. Further, the N+ diffusion layer 7b is connected to the lower terminal n2 of the MTJ element 10. With the above configuration, the gate of the transistor M20 is connected to the word line 13, and the source thereof is connected to the bit line 16, and the drain thereof is connected to the lower terminal n2 of the MTJ element 10. Further, the bit line 16 (/BL) is formed to be extending in the row direction (Y direction) and branched to the column direction (X direction) and connected to the via 25. Thus, the memory cells 100 on the same column are connected to the common bit line 16. Moreover, the bit line 17 (RBL) for reading, which is formed to be extending in the row direction (Y direction), is formed in the fifth interconnection layer M5 in the upper layer of the bit line 16.

As explained above, in the memory cell 100 in this exemplary embodiment, similarly to the first exemplary embodiment, the longitudinal direction of the free magnetic layer 3 has a certain angle to the column direction (X direction), and the MOS transistors M10 and M20 in which the row direction (the negative orientation of the Y direction) is the channel direction are formed for the lower terminals n1 and n2 placed at both ends of the free magnetic layer 3 respectively. Thus, for example, the memory cell 100-11 has the shape in which a rectangle (cell size 2 F×3 F), which contains the word line 14-0 and the bit line 15-1, and a rectangle (cell size 2 F×3 F), which contains the word line 13-1 and the bit line 16-1 are combined. That is, the minimum cell size of the memory cell 100 becomes "12 $F^2$", and the overhead of the cell area becomes zero. Further, in the present invention, the longitudinal direction of the free magnetic layer 3 is at a predetermined angle δ with respect to the column direction (X direction). Thus, the distance between the hard layers 4a and 4b (between the lower terminals n1 and n2) can be made longer than the conventional distance, by 1/cos θ times. For example, in the case of θ=45°, the distance between the hard layers 4a and 4b (between the lower terminals n1 and n2) can be made longer than the conventional distance by 1.41 times. This corresponds to the fact that the distance between the hard layers 4a and 4b and the reference layer 2 can be reserved at the maximum of about 0.4 F. From the above, according to the present invention, while reserving the dimension of the MRAM layer (the MTJ element 10) and the process margin, it is possible to attain the cell size "12 $F^2$" that is the minimum area.

Also in this exemplary embodiment, similarly to the first exemplary embodiment, without becoming to the half-selection state, it is possible to select only the memory cell that is targeted for writing or reading the data accurately. Further, by increasing the distance between the hard layers 4a and 4b and the end of the reference layer 2, it is possible to reduce the writing current to 1 mA or less and simplify peripheral circuits. Thus, according to the present invention, the cell occupation rate in the MRAM can be increased similarly to the DRAM. As a result, a large memory capacity can be achieved.

In the above explanations, among the memory cells 100 commonly connected to the word lines 14, the structure of each of the memory cells 100-(ij+1) (100-i1, 100-i3, - - - ) on the odd-numbered rows located on the positive side of the Y direction with respect to the word line 14 is described. The structure of each of the memory cells 100-ij (100-i0, 100-i2, - - - ) on the even-numbered rows located on the negative side of the Y direction is also similar. The structures of the memory cell 100-ij on the even-numbered row and the memory cell 100-i(j+1) on the odd-numbered row indicate the rotational symmetric structure in which in the X-Y plane, one is rotated by 180° with one point on the word line 14 shared by the respective memory cells as the axis. Further, the word line 14-(j/2) commonly connected to the two memory cells 100-(ij+1) and 100-ij adjacent to each other in the column direction (Y direction) is formed between the word line 13-(j+1) and the word line 13-j that are properly connected to the two memory cells 100-(ij+1) and 100-ij, respectively.

With the above structure, the memory array 101 according to the present invention contains the plurality of memory cell groups, and each of the memory cell groups contains two rows which shares the word line 14 and connected to different word lines 13 respectively.

Also in the MRAM in this exemplary embodiment, similarly to the first exemplary embodiment, for each two rows, the word lines 14 are commonly connected to the memory cell 100. Usually, for each memory cell 100, two word lines are required. However, the number of the word lines can be substantially set to 1.5. That is, in the present invention, when the number of the rows of the memory arrays 101 is n, the number of the word lines becomes 1.5×n.

In the memory cell 100 in the second exemplary embodiment, the bit lines are separated for reading and for writing. Thus, as compared with the first exemplary embodiment, it is suitable for making the speed higher and improving the efficiency of the cell occupation rate. For example, the respective bit lines (sub bit lines) in the plurality of memory arrays are connected through a plurality of switching circuits to a main bit line (the division of bit lines), and a memory cell is selected on the basis of the control signal from the main bit line. In this way, the memory cell is selected on the basis of the main bit line that is not directly connected to the memory array. Consequently, it is possible to reduce the parasitic capacitance on the bit line when the memory cell is selected, and as a consequence, to enhance the access speed to the memory. However, when the bit lines are divided, the cell occupation rate is decreased caused by the area overhead. On the other hand, when the memory cell 100 in this exemplary embodiment is applied to the above configuration, it is possible to adopt an idea such that only the read bit line whose sense current is small is divided and the write bit line whose interconnection current is relatively large is made common between the arrays. For this reason, while minimizing the area overhead for the division, it is possible to make the speed higher.

In this way, also for the memory cell intended to high access speed and high efficiency of the cell occupation rate, it is possible to attain the cell size "12 $F^2$" that is the minimum area while reserving the dimension of the MRAM layer (MTJ element 10) and the process margin, and reduce the number of the word lines.

Next, the selecting method of the memory cell 100 in the second exemplary embodiment will be described below. Since the selecting method of the row address (the operation of the row decoder) is similar to the first exemplary embodiment, its description is omitted. The method for selecting the column address being different from the first exemplary embodiment will be described below in detail.

When the writing operation is carried out, in the state in which the word lines 13 and 14 adjacent to each other are activated (set to the high level), the complementary voltage corresponding to the writing information is applied to the write bit lines 15 and 16 (WBL and /WBL) to which the memory cell 100 of the access target (selection target) is connected. All of the other non-selected word lines and non-selected write bit lines are set to the low level, and all of the bit lines 17 are set to the high impedance state or the low level (for example, the ground level). At this time, the writing current is supplied to the selected cell, the magnetization of the free magnetic layer 3 in the memory cell 100 is inverted, and the information is rewritten. On the other hand, when the storage information in the memory cell 100 is read, in a state in which the word lines 13 and 14 of the access target (selection target) are set to the high level, the voltage Vc of about 0.3V is applied to the bit line 17 to which the selected cell is connected, and the sense current Is flowing through the MTJ element 10 of the selected cell is detected. At this time, all of the non-selected read bit lines are set to the high impedance state, and all of the write bit lines are set to the low level (for example, the ground level).

3. Third Exemplary Embodiment

The configuration and operation in the third exemplary embodiment of the MRAM according to the present invention will be described below in detail with reference to FIGS. 22 to 30. In the second exemplary embodiment, the two transistors M10 and M20 are used to control the selection of the MTJ element 10. In the third exemplary embodiment, four transistors M11, M12, M21, M22 are used to control the selection of the MTJ element 10. The other points are similar to the second exemplary embodiment. Hereafter, the items differing from the second exemplary embodiment are mainly described.

Figure 22:
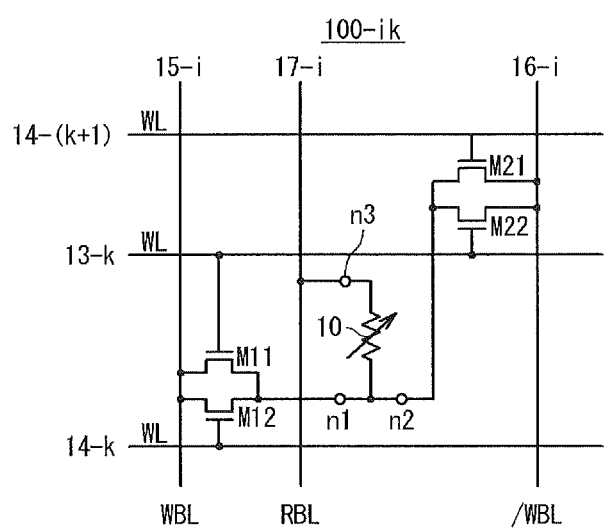
FIG. 22 is a circuit diagram showing a configuration in a third exemplary embodiment of the MRAM cell according to the present invention.

FIG. 22 is a circuit diagram showing the configuration in the third exemplary embodiment of the MRAM cell (memory cell 100) according to the present invention. With reference to FIG. 22, the memory cell 100 in the third exemplary embodiment is an MRAM cell of a so-called 4T1MTJ cell configuration, which contains the four transistors M11, M12, M21 and M22 and the 3-terminal MTJ element 10.

With reference to FIG. 22, the configuration of the memory cell 100 on the X-th row, i-th column in this exemplary embodiment is described in detail. Here, the configuration of the memory cell 100-*ik* on the (X=k)-th row is described in detail. Here, X, i and k are integers. In this exemplary embodiment, the memory cell 100-*ik* on the (X=k)-th row is connected to the common word lines 14-*k* and 14-(*k*+1) to the memory cells 100-*i*(k−1) and 100-*i*(k+1) on its adjacent rows (X=(k−1)-th row, (k+1)-th row), respectively. The configuration of the memory cell 100 in this exemplary embodiment will be described below in detail.

The memory cell 100-*ik* on the (X=k)-th row, i-th column contains: the transistors M11 and M22 connected to the word line 13-*k* proper to the k-th row; the transistor M21 connected to the word line 14-(*k*+1); the transistor M12 connected to the word line 14-*k*; and the MTJ element 10. In detail, the gate of the transistor M11 is connected to the word line 13-*k* (WL), the source thereof is connected to the bit line 15-*i* (WBL) for writing, and the drain thereof is connected to the lower terminal n1 of the MTJ element 10. The gate of the transistor M12 is connected to the word line 14-*k* (WL), the source thereof is connected to the bit line 15-*i* (WBL) for writing, and the drain thereof is connected to the lower terminal n1 of the MTJ element 10. The gate of the transistor M21 is connected to the word line 14-(*k*+1) (WL), the source thereof is connected to the bit line 16-*i* (/WBL) for writing, and the drain thereof is connected to the lower terminal n2 of the MTJ element 10. The gate of the transistor M22 is connected to the word line 13-*k* (WL), the source thereof is connected to the bit line 16-*i* (/WBL) for writing, and the drain thereof is connected to the lower terminal n2 of the MTJ element 10. The MTJ element 10 is a variable resistance element and contains the lower terminals n1, n2 and n3. The lower terminal n1 is connected through the transistors M11 and M12 to the bit line 15-*i*. The lower terminal n2 is connected through the transistors M21 and M22 to the bit line 16-*i*. Also, the lower terminal n3 is connected to the bit line 17-*i* (RBL) for reading.

Figure 23:
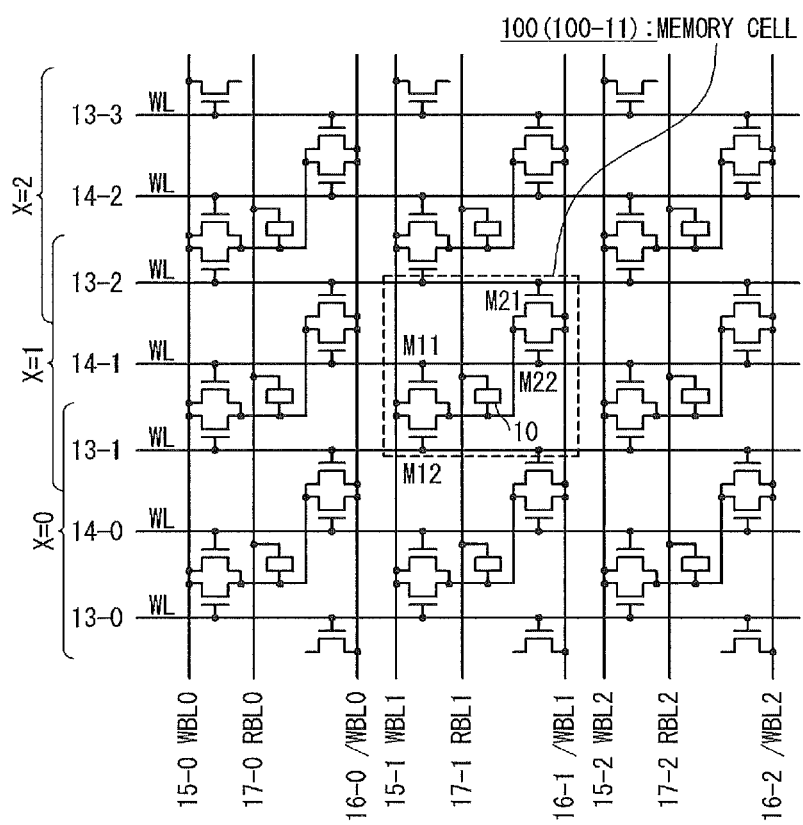
FIG. 23 is a circuit diagram showing a configuration of a memory array in which the memory cells shown in FIG. 22 are arrayed in 4 rows×3 columns.

FIG. 23 is a circuit diagram showing the configuration of the memory array 101 in which the memory cells 100 shown in FIG. 22 are arrayed in 4 rows×3 columns. With reference to FIG. 23, in the third exemplary embodiment, similarly to the second exemplary embodiment, the memory cells 100 on the same i-th column are connected to the same bit lines 15-*i* and 16-*i* for writing and the bit line 17-*i* for reading. Further, the memory cells 100 are connected to the three bit lines. The memory cells 100 share the word line 14 together with the memory cells 100 adjacent in the positive orientation and negative orientation of the row direction (Y direction), and the memory cells 100 on the same column are connected to the common bit lines 15, 16 and 17.

With the structure of the memory cell 100-11 as an example, the layout structure of the memory cell 100 in this exemplary embodiment will be described below in detail.

Figure 25:
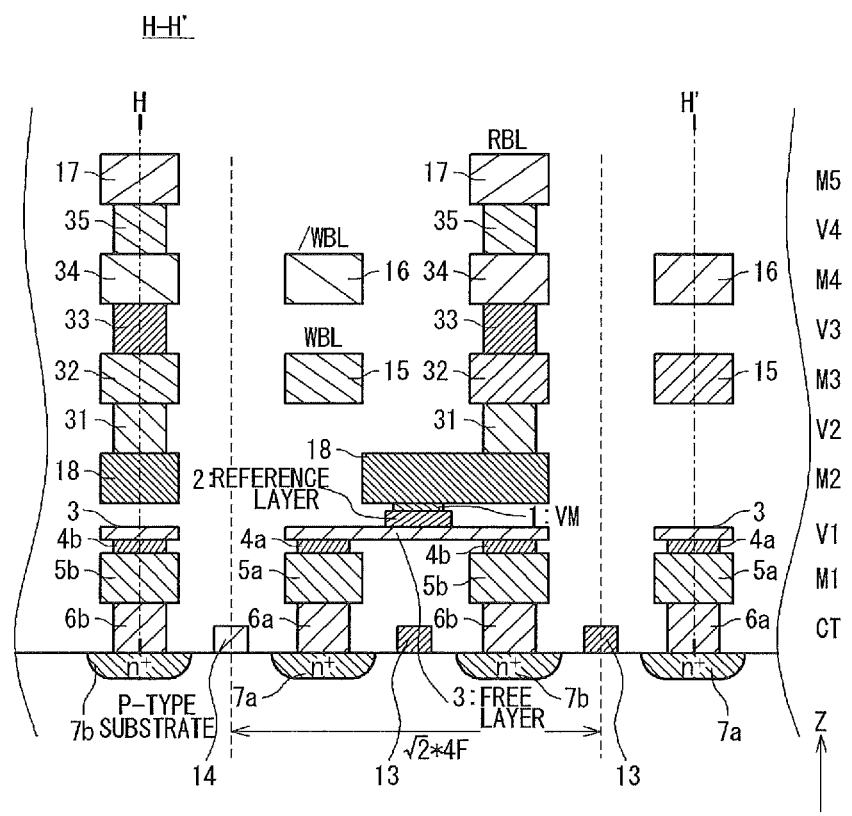
FIG. 25 is an H-H' cross-sectional view in FIGS. 24A to 24E.
Figure 26:
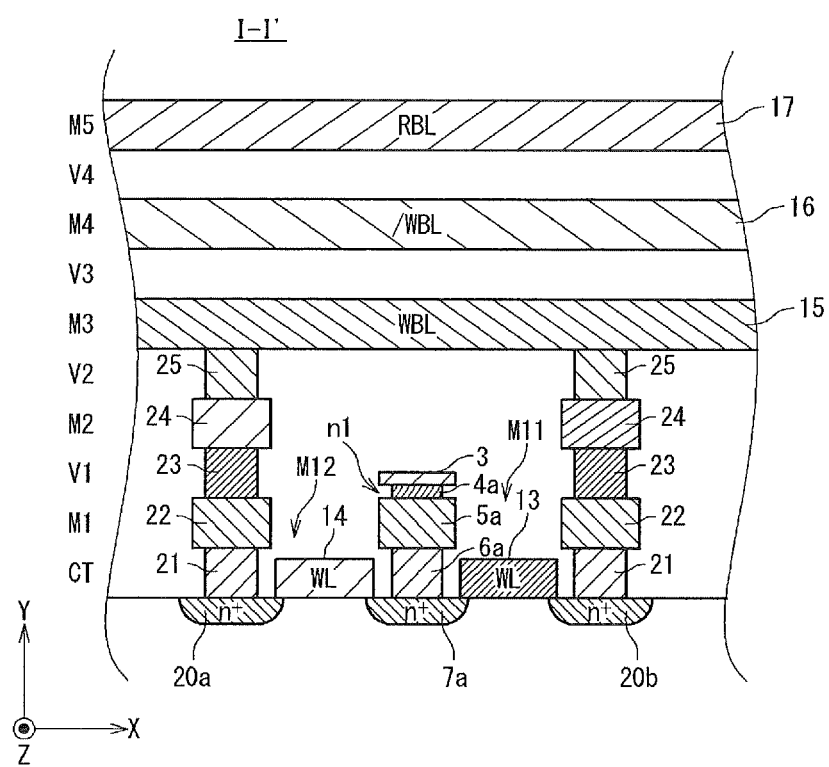
FIG. 26 is an I-I' cross-sectional view in FIGS. 24A to 24E.
Figure 27:
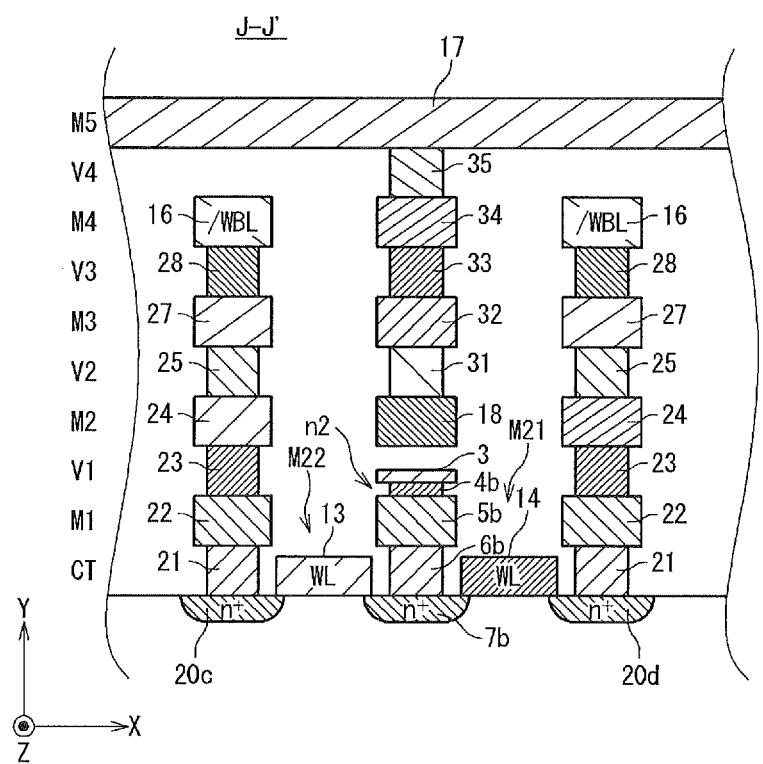
FIG. 27 is a J-J' cross-sectional view in FIGS. 24A to 24E.

FIGS. 24A to 24E are plan views showing the layout structure of the memory array shown in FIG. 23. FIGS. 24A to 24E show the plan views of the memory array 101 in which the MTJ element 10 of the domain wall displacement type is used as an example. FIG. 25 is the H-H' cross-sectional view in FIGS. 248A to 24E. FIG. 26 is the I-I' cross-sectional view in FIGS. 24A to 24E. FIG. 27 is the J-J' cross-sectional view in FIGS. 24A to 24E.

Figure 24A:
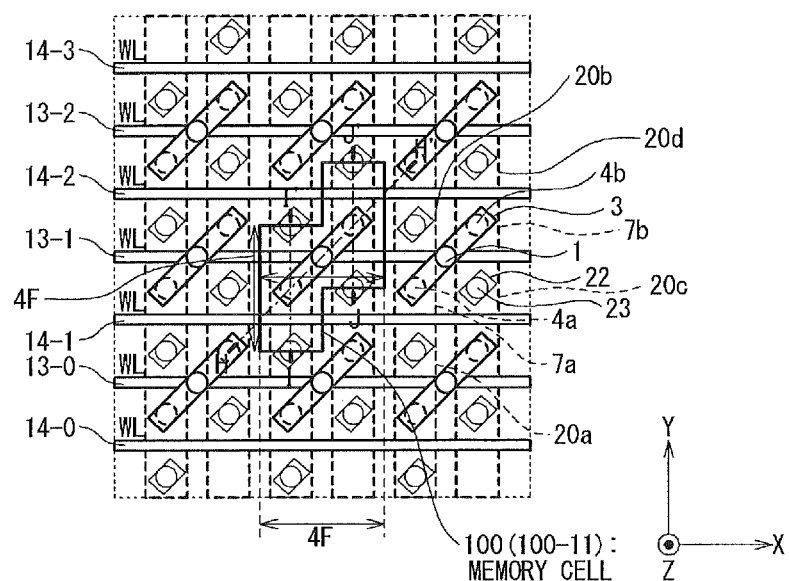
FIG. 24A is a plan view showing an example of a layout structure of the memory array shown in FIG. 23.
Figure 24B:
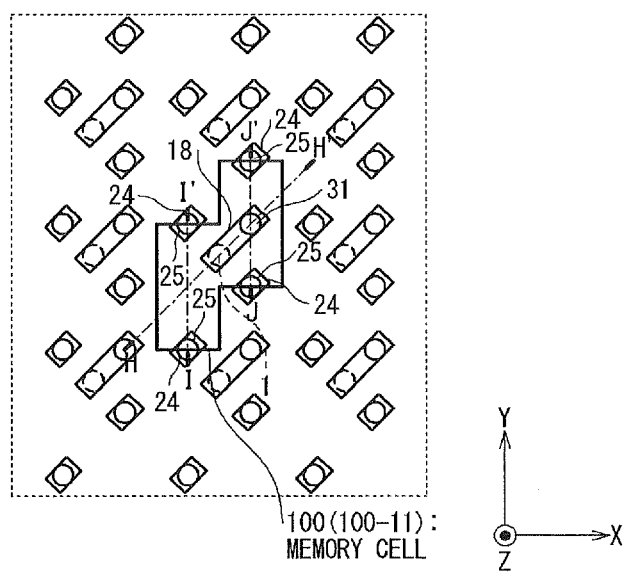
FIG. 24B is a plan view showing an example of the layout structure of the memory array shown in FIG. 23.
Figure 24C:
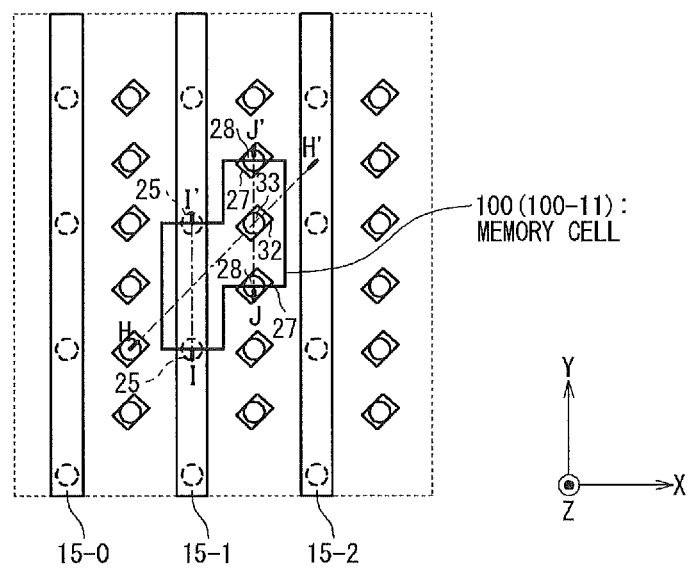
FIG. 24C is a plan view showing an example of the layout structure of the memory array shown in FIG. 23.
Figure 24D:
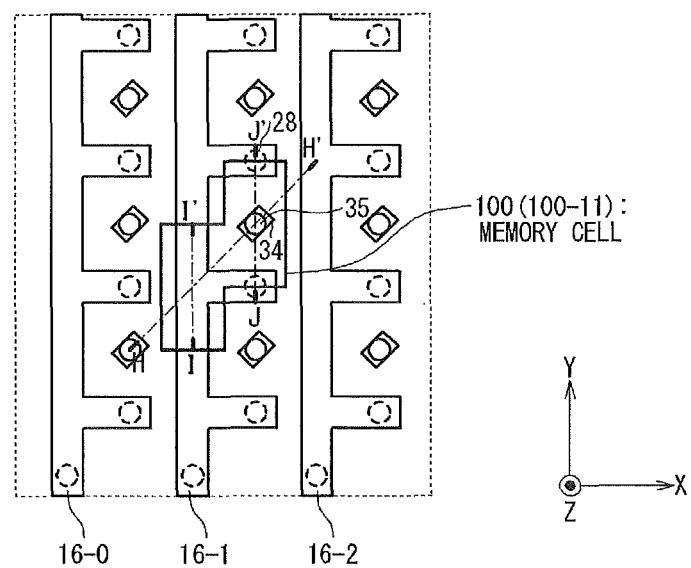
FIG. 24D is a plan view showing an example of the layout structure of the memory array shown in FIG. 23.
Figure 24E:
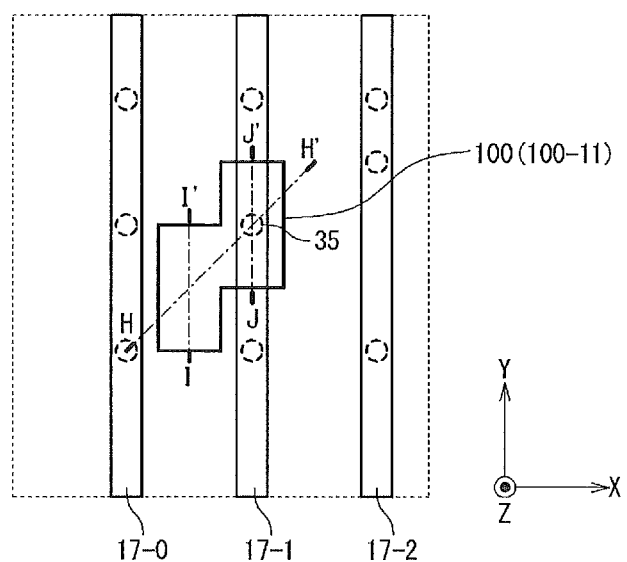
FIG. 24E is a plan view showing an example of the layout structure of the memory array shown in FIG. 23.

FIG. 24A is the plan view showing the structure from the substrate to the MTJ element formation layer (first via formation layer V1) just under the second interconnection layer M2. FIG. 24B is the plan view showing the structure from the second interconnection layer M2 to the second via formation layer V2 just under the third interconnection layer M3. FIG. 24C is the plan view showing the structure from the third interconnection layer M3 to the third via formation layer V3 just under the fourth interconnection layer M4. FIG. 24D is the plan view showing the structure from the fourth interconnection layer M4 to the fourth via formation layer V4 just under the fifth interconnection layer M5. FIG. 24E is the plan view showing the structure of the upper layer from the fifth interconnection layer.

With reference to FIG. 24A, the free magnetic layer 3 of the memory cell 100 in this exemplary embodiment is formed to be extending whose longitudinal direction is at a predetermined angle with respect to the column direction (X direction) in the X-Y plane, similarly to the second exemplary embodiment. In this exemplary embodiment, since the word lines 13 and 14 are formed to be extending in the X direction, the free magnetic layer 3 is formed to be extending in the direction (angle θ) being different from the extension direction of the word lines 13 and 14. Consequently, the distance between the hard layers 4a and 4b (between the terminals n1 and n2) along the free magnetic layer 3 can be increased by 1/cos θ times, as compared with the layout shown in FIGS. 5A to 5C. For example, in the case of θ=45°, the distance between the hard layers 4a and 4b along the free magnetic layer 3 is increased by $2^{(1/2)}$ times.

With reference to FIGS. 24A and 25, the structure of the MTJ element 10 in this exemplary embodiment is similar to the second exemplary embodiment. Thus, its detailed description is omitted. However, in this exemplary embodiment, all of the MTJ elements 10 on the memory array 101 show the same structure. Further, the word lines 13 and the word lines 14 are alternately arranged for the column direction (Y direction).

The structure of the transistors M11 and M12 in this exemplary embodiment will be described below with reference to FIGS. 24A to 24E and FIG. 26. The transistor M12 contains the word line 14 functioning as the gate, the N+ diffusion layer 20a functioning as the source, and the N+ diffusion layer 7a functioning as the drain. The N+ diffusion layer 20a is formed in the P-type substrate at the position that is separated at a predetermined interval in a predetermined orientation (here, the negative orientation) of the Y direction with respect to the N+ diffusion layer 7a. The word line 14 is formed to be extending in the column direction (X direction) on the P-type substrate between the N+ diffusion layers 7a and 20a. The N+ diffusion layer 20a is connected to the bit line 15 (WBL) for writing, through the contact 21, the metal interconnection 22, the via 23, the metal interconnection 24 and the via 25, which are laminated in turn from the lower layer. Further, the N+ diffusion layer 7a is connected to the lower terminal n1 of the MTJ element 10. With the above configuration, the gate of the transistor M12 is connected to the word line 14 that is common to the other memory cells 100, and the source is connected to the bit line 15, and the drain is connected to the lower terminal n1 of the MTJ element 10.

Moreover, the transistor M11 contains the word line 13 functioning as the gate, the N+ diffusion layer 20b functioning as the source, and the N+ diffusion layer 7a functioning as the drain. The N+ diffusion layer 20b is formed in the P-type substrate at the position that is separated at a predetermined interval in a predetermined orientation (here, the positive orientation) of the Y direction with respect to the N+ diffusion layer 7a. The word line 13 is formed to be extending in the column direction (X direction) on the P-type substrate between the N+ diffusion layers 7a and 20b. The N+ diffusion layer 20b is connected to the bit line 15 (WBL) for writing, through the contact 21, the metal interconnection 22, the via 23, the metal interconnection 24 and the via 25, which are laminated in turn from the lower layer. Further, the N+ diffusion layer 7a is connected to the lower terminal n1 of the MTJ element 10. With the above configuration, the gate of the transistor M11 is connected to the word line 13, and the source is connected to the bit line 15, and the drain is connected to the lower terminal n1 of the MTJ element 10.

The bit line 15 (WBL) is formed to be extending in the row direction (Y direction). Thus, the memory cells 100 on the same column are connected to the common bit line 15. Further, the bit line 16 (/WBL) for writing, which is formed to be extending in the row direction (Y direction), is formed in the fourth interconnection layer M4 in the upper layer of the bit line 15, and the bit line 17 (RBL) for reading, which is formed to be extending in the row direction (Y direction), is formed in the fifth interconnection layer M5 in its upper layer.

The structure of the transistors M21 and M22 in this exemplary embodiment will be described below with reference to FIGS. 24A to 24E and FIG. 27. The transistor M22 contains the word line 13 functioning as the gate, an N+ diffusion layer 20c functioning as the source, and the N+ diffusion layer 7b functioning as the drain. The N+ diffusion layer 20c is formed in the P-type substrate at the position that is separated at a predetermined interval in a predetermined orientation (here, the negative orientation) of the Y direction with respect to the N+ diffusion layer 7b. The word line 13 is formed to be extending in the column direction (X direction) on the P-type substrate between the N+ diffusion layers 7b and 20c. The N+ diffusion layer 20c is connected to the bit line 16 (/WBL) for writing, through the contact 21, the metal interconnection 22, the via 23, the metal interconnection 24, the via 25, a metal interconnection 27 and a via 28, which are laminated in turn from the lower layer. Further, the N+ diffusion layer 7b is connected to the lower terminal n2 of the MTJ element 10. With the above configuration, the gate of the transistor M22 is connected to the word line 13, and the source is connected to the bit line 16, and the drain is connected to the lower terminal n2 of the MTJ element 10.

Moreover, the transistor M21 contains the word line 13 functioning as the gate, an N+ diffusion layer 20d functioning as the source, and the N+ diffusion layer 7b functioning as the drain. The N+ diffusion layer 20d is formed in the P-type substrate at the position that is separated at a predetermined interval in a predetermined orientation (here, the positive orientation) of the Y direction with respect to the N+ diffusion layer 7b. The word line 13 is formed to be extending in the column direction (X direction) on the P-type substrate between the N+ diffusion layers 7b and 20d. The N+ diffusion layer 20d is connected to the bit line 16 (/WBL) for writing, through the contact 21, the metal interconnection 22, the via 23, the metal interconnection 24, the via 25, the metal interconnection 27 and the via 28, which are laminated in turn from the lower layer. Further, the N+ diffusion layer 7b is connected to the lower terminal n2 of the MTJ element 10. With the above configuration, the gate of the transistor M21 is connected to the word line 13, and the source is connected to the bit line 16, and the drain is connected to the lower terminal n2 of the MTJ element 10.

Moreover, the bit line 16 (/BL) is formed to be extending in the row direction (Y direction) and branched to the column direction (X direction) and connected to the via 25. For this reason, the memory cells 100 on the same column are connected to the common bit line 16. Moreover, the bit line 17 (RBL) for reading, which is formed to be extending in the row direction (Y direction), is formed in the fifth interconnection layer M5 in the upper layer of the bit line 16.

In the first and second exemplary embodiments, the memory array 101 is configured such that the memory cells 100-$ij$ and 100-$i$(j+1) on the two rows, which are commonly connected to the word line 14 and adjacent to each other, are defined as one unit. In this case, the configurations of the memory cell 100 on the odd-numbered row and the memory cell 100 on the even numbered row are different from each other. Thus, in the memory array 101, it is difficult to lay out the diffusion layers and the interconnections continuously on the same pattern. On the other hand, in the third exemplary embodiment, all of the memory cells 100 on the memory array 101 can be designed to be the same structure. Thus, it is possible to design the diffusion layers and the interconnections continuously by the same pattern.

As explained above, in the memory cell 100 in this exemplary embodiment, the longitudinal direction of the free magnetic layer 3 has a certain angle to the column direction (X direction). The four MOS transistors M11, M12, M21 and M22 in which the row direction (Y direction) is the channel direction are formed in each of the lower terminals n1 and n2 placed on both ends of the free magnetic layer 3. Thus, for example, the memory cell 100-11 has the shape in which a rectangle (cell size 2 F×4 F), which contains the word lines 13-1 and 14-1 and the bit line 15-1, and a rectangle (cell size 2 F×4 F), which contains the word lines 13-1 and 14-2 and the bit line 16-1, are combined. In this exemplary embodiment, the number of the transistors is increased to 4, as compared with the second exemplary embodiment. Thus, the cell area, which is minimized in accordance with the design rule, becomes 16 $F^2$. In the case of the above shape, the minimum cell size of the memory cell 100 becomes "16 $F^2$". Hence, the overhead of the cell area becomes zero.

Further, in this exemplary embodiment, similarly to the first and second exemplary embodiments, the longitudinal direction of the free magnetic layer 3 is at a predetermined angle θ with respect to the column direction (X direction). Thus, the distance between the hard layers 4a and 4b (between the lower terminals n1 and n2) can be made longer than the conventional distance, by 1/cos θ times. For example, in the case of θ=45°, the distance between the hard layers 4a and 4b (between the lower terminals n1 and n2) can be made longer than the conventional distance, by 1.41 times. This corresponds to the fact that the distance between the hard layers 4a and 4b and the reference layer 2 can be reserved at the maximum of about 0.4 F. From the above, according to the present invention, while reserving the dimension of the MRAM layer (the MTJ element 10) and the process margin, it is possible to attain the cell size "12 $F^2$" that is the minimum area.

Even in this exemplary embodiment, similarly to the first and second exemplary embodiments, without becoming to the half-selection state, it is possible to select only the memory cell that is targeted for writing or reading the data accurately. Further, by increasing the distance between the hard layers 4a and 4b and the end of the reference layer 2, it is possible to reduce the writing current to 1 mA or less and simplify peripheral circuits. Thus, according to the present invention, the cell occupation rate in the MRAM can be increased similarly to the DRAM. As a result, a larger memory capacity can be achieved.

With the above structure, the memory arrays 101 according to the present invention contains a plurality of memory cell groups, and each of the memory cell groups contains two rows which shares the word line 14 and connected to different word lines 13 respectively.

In this exemplary embodiment, among the three word lines required for one memory cell, the two word lines are shaped with another memory cell. Thus, when the number of the rows of the memory arrays is n, the number of the required word lines becomes 2×n+1.

Further, in this exemplary embodiment, similarly to the second exemplary embodiment, it is possible to adopt an idea such that only the read bit line whose sense current is small is divided and the write bit line whose interconnection current is relatively great is made common between the arrays. For this reason, while minimizing the area overhead for the division, is possible to make the speed higher.

In this way, even in the memory cell intended to high access speed and high efficiency of the cell occupation rate, it is possible to attain the cell size "12 $F^2$" that is the minimum area while reserving the dimension of the MRAM layer (MTJ element 10) and the process margin, and reduce the number of the word lines.

Figure 28:
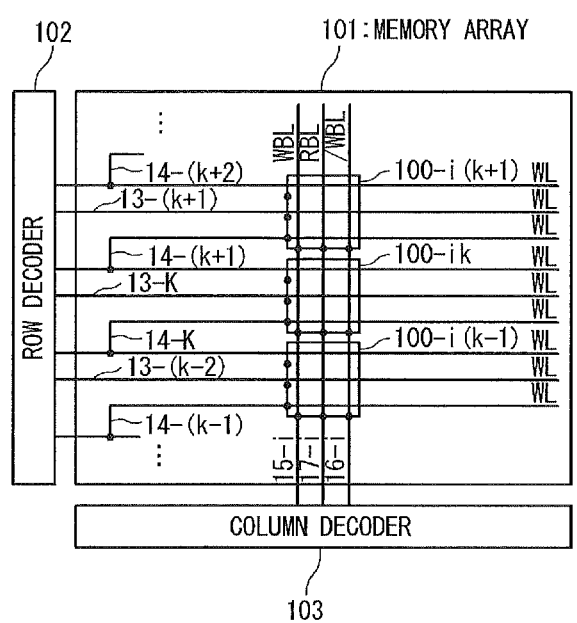
FIG. 28 is a block diagram showing a configuration in the third exemplary embodiment of the semiconductor storage device in which the MRAM according to the present invention is mounted.

The configuration and operation in the third exemplary embodiment of the semiconductor storage device in which the MRAM according to the present invention is mounted will be described below in detail, with reference to FIGS. 28 to 30. FIG. 28 is the block diagram showing the configuration in the third exemplary embodiment of the semiconductor storage device in which the MRAM according to the present invention is mounted.

With reference to FIG. 28, in the semiconductor storage device in the third exemplary embodiment, the word lines 14-$k$ is commonly connected to the memory cell 100-$ik$ and the memory cell 100-$i$(k−1) adjacent in the row direction. The word line 14-$k$+1 is commonly connected to the memory cell 100-$ik$ and the memory cell 100-$i$(k+1) adjacent in the row direction. The word lines 13-($k$−1), 13-$k$ and 13-($k$+1) serve as the word lines dedicated to the memory cells 100-$i$(k−1), 100-$ik$ and 100-$i$(k+1), respectively.

Figure 29:
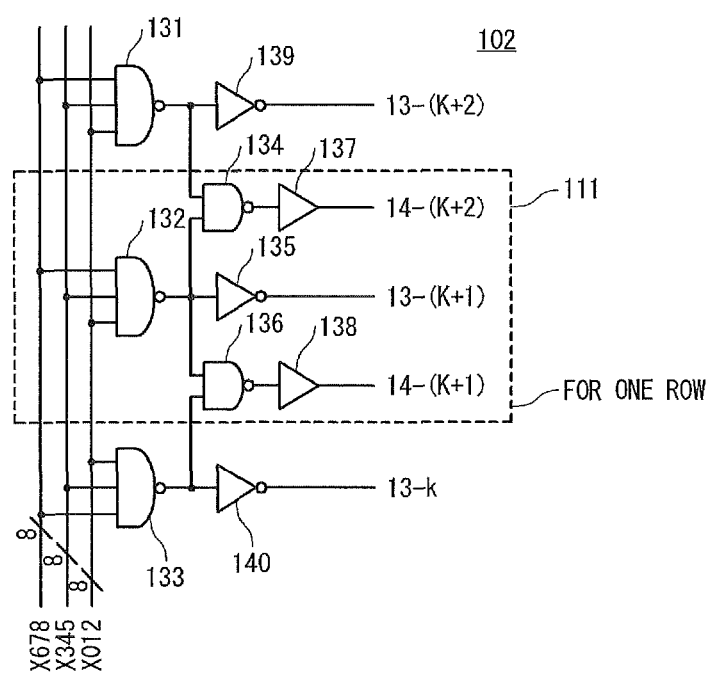
FIG. 29 is a circuit diagram showing a partial configuration of a row decoder shown in FIG. 28.

FIG. 29 is a circuit diagram showing a partial configuration of the row decoder shown in FIG. 28. With reference to FIG. 28, the row decoder 102 contains the logic circuit 111 for driving the word lines of one row (X=k-th row) correspondingly to the address signals "X012", "X345" and "X678" each having 8 bits. Here, the decoder circuit (logic circuit 111) for driving the word lines 14-($k$+2), 13-($k$+1) and 14-($k$+1) connected to the memory cell 100-$i$(k+1) corresponding of one row (X=(k+1)-th row) is shown as an example. The logic circuit 111 in the third exemplary embodiment contains NAND circuits 132, 134 and 136, a NOT circuit 135, and buffers 137 and 138.

The NAND circuit 132 drives the word line 13-($k$+1) through the NOT circuit 135. In detail, a signal of the lower (k+2)-th bit corresponding to the row address X=k+1, in each of the 8-bit address signals "X012", "X345" and "X678" is selectively inputted to the NAND circuit 132.

Similarly, a NAND circuit 131 for driving the word line 13-($k$+2) through a NOT circuit 139 is mounted in the logic circuit 111 for driving the memory cell 100-$i$(k+2) on the adjacent row X=k+2. Further, a NAND circuit 133 for driving the word line 13-*k* through a NOT circuit 140 is mounted in the logic circuit 111 for driving the memory cell 100-*ik* on the adjacent row X=k. A signal of the lower (k+3)-th bit corresponding to the row address X=k+2, in each of the 8-bit address signals "X012", "X345" and "X678" is selectively inputted to the NAND circuit 131. Similarly, a signal of the lower (k+1)-th bit corresponding to the row address X=k, in each of the 8-bit address signals "X012", "X345" and "X678" is selectively inputted to the NAND circuit 133.

The outputs of the NAND circuits 131 and 132 are inputted to the NAND circuit 134, and its NAND calculation result is outputted through the buffer 137 to the word line 14-(*k*+2). That is, the OR calculation result of a signal of the lower (k+3)-th bit and a signal of the lower (k+2)-th bit in the 8-bit address signals "X012", "X345" and "X678" is outputted to the word line 14-(*k*+2). Consequently, the word line 14-(*k*+2) is activated because at least one of the word lines 13-(*k*+1) and 13-(*k*+2) is activated (it becomes the high level).

Further, the outputs of the NAND circuits 132 and 133 are inputted to the NAND circuit 136, and its NAND calculation result is outputted through the buffer 138 to the word line 14-(*k*+1). That is, the OR calculation result of the signal of the lower (k+2)-th bit and a signal of the lower (k+1)-th bit in the 8-bit address signals "X012", "X345" and "X678" is outputted to the word line 14-(*k*+1). Consequently, 14-(*k*+1) is activated because at least one of the word lines 13-(*k*+1) and 13-k is activated (it becomes the high level).

As an example, the operation of the logic circuit 111 (k=0) for driving the memory cell 100-*i*1 of a row address X=1 is described. The NAND circuit 132 outputs the NAND calculation result of the decoding signal on the lower second bit in each of the address signals "X012", "X345" and "X678" to the NAND circuits 134 and 136 and the NOT circuit 135. The NAND circuit 131 outputs the NAND calculation result of the decoding signal on the lower third bit in each of the address signals "X012", "X345" and "X678", to the NOT circuit 139 and the NAND circuit 134. The NAND circuit 133 outputs the NAND calculation result of the decoding signal on the lower first bit in each of the address signals "X012", "X345" and "X678" to the NOT circuit 140 and the NAND circuit 136. The NAND circuit 134 outputs the NAND calculation result of the input signal through the buffer 137 to the word line 14-2. Further, the NOT circuit 135 outputs an inversion signal of the input signal from the NAND circuit 132 to the word line 13-1. Moreover, the NAND circuit 136 outputs the NAND calculation result of the input signal through the buffer 138 to the word line 14-1.

Note that, the NAND circuit 134 and the buffer 137 are also used as the logic circuit 111 for the adjacent (X=k+2)-th row, and the NAND circuit 136 and the buffer 138 are also used as the logic circuit 111 for the adjacent (X=k)-th row.

FIG. 30 is an example of the truth table that indicates the operation of the row decoder 102 shown in FIG. 28. FIG. 30 shows the truth table that indicates the word lines 13 and 14 activated correspondingly to the selected row address "X". In this exemplary embodiment, when the memory cell 100-*ik* on the (X=k)-th row is selected, the row decoder 102 sets only the three word lines 14-*k*, 13-*k* and 14-(*k*+1) to the high level, and sets the other word lines 13 and 14 to the low level. For example, when (the memory cell 100-*i*0) on the row address "X=0 (k=0)" is selected, the row decoder 102 sets the word lines 13-0, 14-0 and 14-1 to the high level, and sets all of the other word lines 13 and 14 to the low level. Similarly, when the row address "X=1 (k=1)" (the memory cell 100-*i*1) is selected, the row decoder 102 sets the word line 14-0 and the word lines 13-1, 14-1 and 14-2 to the high level, and sets all of the other word lines 13 and 14 to the low level.

Except that the selecting method of the row address is different, the accessing method to the memory cell 100 is similar to the second exemplary embodiment. For example, when the data is written to the memory cell 100-*ik* on the (X=k)-th row, i-th column, in the state in which the word lines 13-*k*, 14-*k* and 14-(*k*+1) are set to the high level, the complementary voltage corresponding to the writing information is applied to the write bit lines 15 and 16 (WBL, /WBL) to which the memory cell 100 of the access target (selection target) is connected. All of the other non-selected word lines and non-selected write bit lines are set to the low level, and all of the read bit lines 17 are set to the high impedance state or the low level (for example, the ground level). At this time, the writing current is supplied to the selected cell, and the magnetization of the free magnetic layer 3 in the MTJ element 10 is inverted, thereby rewriting the information. On the other hand, when the data stored in the memory cell 100 is read, in a state in which the word lines 13 and 14 of the access target (selection target) are set to the high level, the voltage Vc of about 0.3V is applied to the read bit line 17 to which the selected cell is connected, and the sense current Is flowing through the MTJ element 10 of the selected cell is detected. At this time, all of the non-selected read bit lines are set to the high impedance state, and all of the write bit lines are set to the low level (for example, the ground level).

The ideal cell area of the memory cell 100 in the third exemplary embodiment is 16 $F^2$, which is about 1.3 times as compared with the first and second exemplary embodiments. However, the writing current that can be supplied to the memory cell 100 can be increased to two times. Further, as shown in FIG. 24A, the patterns of the MRAM layers (MTJ elements 10) become equal in interval. Consequently, the leaked magnetic field between the cells adjacent to each other becomes uniform, and all of the cells become magnetically uniform.

As explained above, in the present invention, in the MRAM that uses a 3-terminal MTJ element, the longitudinal direction of the free magnetic layer 3 (electrically conductive layer) in the MTJ element 10 is different from the row direction (X direction) of the memory cell column. Therefore, without changing the length of the row direction (X direction) of the memory cell 100, it is possible to reserve several tens of nm or more of the distance between the barrier layer 9 and the lower electrode (hard layers 4*a* and 4*b*) along the free magnetic layer 3. Namely, according to the present invention, without increasing the cell size of the memory cell 100, it is possible to enlarge the free layer region in which the reference layer 2 is not formed, and it is possible to consequently prevent the domain wall from stopping in this region.

Figure 1A:
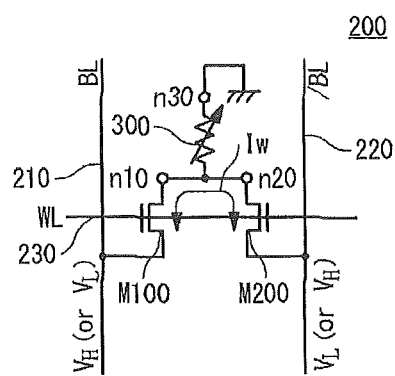
FIG. 1A is a circuit diagram showing the configuration of an MRAM cell described in Japanese Patent No. 3888463.
Figure 1B:
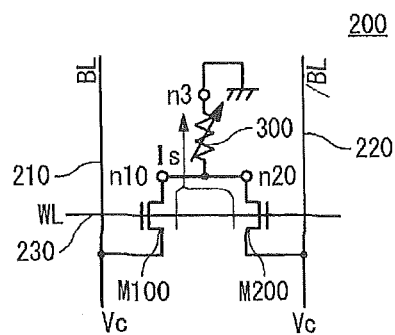
FIG. 1B is a circuit diagram showing the configuration of an MRAM cell described in Japanese Patent No. 3888463.
Figure 2:
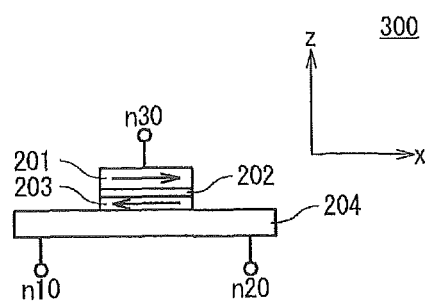
FIG. 2 is a cross-sectional view showing a structure of an MTJ element of the magnetic field writing type.
Figure 3:
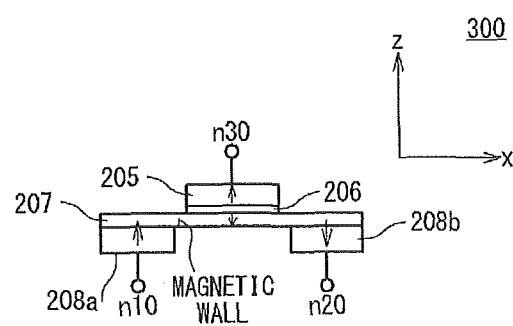
FIG. 3 is a cross-sectional view showing a structure of an MTJ element 300 of the domain wall displacement type.
Figure 4:
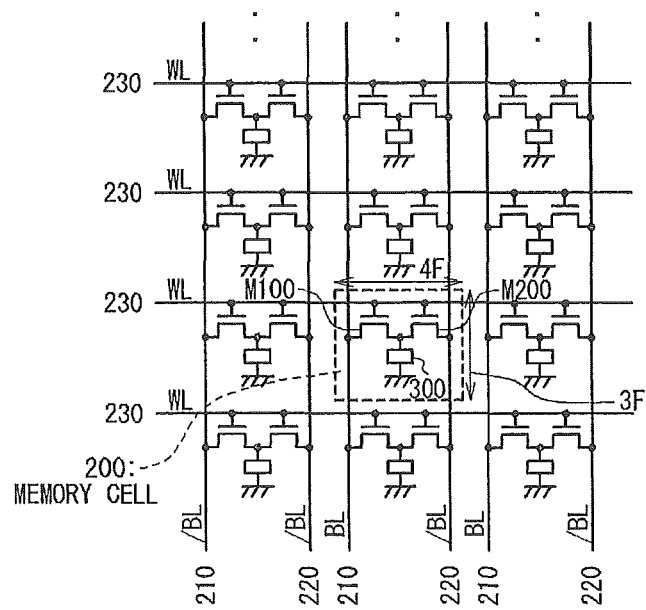
FIG. 4 is a circuit diagram showing a configuration of a memory array in which the memory cells shown in FIG. 1A are arrayed in 4 rows×3 columns.

Moreover, the present invention can also be applied to the MRAM which uses the MTJ element of the magnetic field writing type shown in FIG. 2, in the range where any technical conflict does not occur. When the present invention is applied to the MRAM of the magnetic field writing type, similarly to the above explanation, it is possible to reserve several tens of nm or more of the distance between the barrier layer and the lower electrode along the free magnetic layer, without changing the length of the row direction (X direction) of the memory cell. Consequently, even if the surface of the free magnetic layer is flattened at the level of atom order, it is possible to form the barrier layer appropriately and suppress the increase in the cell size of the memory cell.

Moreover, in the present invention, in the memory cell 100 that is selectively controlled through the plurality of different word lines, since any of the word lines is shared with a memory cell on an adjacent row, the memory cells can be efficiently arranged while reducing the number of the word lines. Consequently, the area cost of the MRAM can be reduced.

As explained above, some exemplary embodiments of the present invention have been described in detail. However, the specific configuration is not limited to the above-explained exemplary embodiments. Even any modification is applied to in the range without departing from the scope of the present invention, it is included in the present invention. The first to third exemplary embodiments can be combined in a technically possible range. In the above-explained exemplary embodiments, the MOSFET as the selection control transistor has been described as an example. However, if the switching operation is possible, any transistor of a different structure may be used.

A part or all of the above-mentioned exemplary embodiments can be described as indicated in the following supplemental notes. However, it is not limited to the followings.

(Supplemental Note 1)

A semiconductor storage device contains:

a plurality of memory cells arranged in a row direction and in a column direction being orthogonal to the row direction;

a first word line extending in the column direction; and a second word line extending in the column direction, wherein each of the plurality of memory cells contains:

a magnetoresistive element having a first lower terminal and a second lower terminal which are respectively connected to both ends of a conductive layer whose longitudinal direction is different from the column direction;

a first transistor whose drain is connected to the first lower terminal and whose gate is connected to the first word line; and a second transistor whose drain is connected to the second lower terminal and whose gate is connected to the second word line, wherein the gate of the first transistor of each of at least two memory cells among the plurality of memory cells and which are adjacent to each other in the row direction is commonly connected to the first word line.

(Supplemental Note 2)

The semiconductor storage device according to supplemental note 1, wherein each of the plurality of memory cells further contains:

a first bit line extending in the column direction and connected to a source of the first transistor;

a second bit line extending in the column direction and connected to a source of the second transistor;

wherein the first transistor in one of two memory cells among the plurality of memory cells and being adjacent to each other in the column direction and the second transistor in another one of the two memory cells are commonly connected to the first bit line, and the first transistor in the another one of the two memory cells and the second transistor in the one of the two memory cells are commonly connected to the second bit line.

(Supplemental Note 3)

The semiconductor storage device according to supplemental note 2, further containing:

a third bit line for reading being extending in the row direction and connected to an upper terminal of the magnetoresistive element, wherein each of the first bit line and the second bit line are used as a bit line for writing.

(Supplemental Note 4)

The semiconductor storage device according to any of supplemental notes 1 to 3, wherein the first transistor contains: a first diffusion layer formed in a lower layer of the first lower terminal and functions as a drain; and a second diffusion layer formed in a position separated at a predetermined interval to a first orientation of the row direction from the first diffusion layer and functions as a source, wherein the first word line is formed on a substrate between the first diffusion layer and the second diffusion layer and functions as a gate of the first transistor, wherein the second transistor contains: a third diffusion layer formed in a lower layer of the second lower terminal and functions as a drain; and a fourth diffusion layer formed in a position separated at a predetermined interval to the first orientation from the first diffusion layer and functions as a source, and the second word line is formed on a substrate between the third diffusion layer and the fourth diffusion layer and functions as a gate of the second transistor.

(Supplemental Note 5)

The semiconductor storage device according to any of supplemental notes 1 to 4, where in the plurality of memory cells contains:

a first memory cell arranged in an odd-numbered row; and a second memory cell arranged in a position adjacent to the first memory cell and in an even-numbered row, wherein the first word line commonly connected to the first memory cell and the second memory cell is arranged between a word line properly connected to the first memory cell and a word line properly connected to the second memory cell.

(Supplemental Note 6)

The semiconductor storage device according to supplemental note 5, wherein the first memory cell contains the first transistor and the second transistor, and the second memory cell contains:

a magnetoresistive element having a third lower terminal and a fourth lower terminal which are respectively connected to both ends of a conductive layer whose longitudinal direction is different from the column direction;

a third transistor whose drain is connected to the third lower terminal and whose gate is connected to the second word line; and a fourth transistor whose drain is connected to the fourth lower terminal and whose gate is connected to the first word line.

(Supplemental Note 7)

The semiconductor storage device according to any of supplemental notes 1 to 6, further containing;

a memory array which contains: the plurality of memory cells; the first word line; and the second word line; and a row decoder configured to select a memory cell row among the plurality of memory cells being an access target by outputting a control signal to the first word line and the second word line, wherein the row decoder is configured to activate the first word line and the second word line which are connected to a memory cell being the access target, and inactivate word lines other than the access target.

(Supplemental Note 8)

7. The semiconductor storage device according to any of supplemental notes 1 to 4, wherein each of the plurality of memory cells further contains:

a third word line extending in the column direction;

a third transistor whose drain is connected to the first lower terminal and whose gate is connected to the second word line; and a fourth transistor whose drain is connected to the second lower terminal and whose gate is connected to the third word line, wherein the second word line is formed between the first word line and the third word line, wherein in the plurality of memory cells, a second memory cell being adjacent to the first memory cell to a positive orientation in the row direction and the first memory cell are commonly connected to the third word line, and a third memory cell being adjacent to the first memory cell to a negative orientation in the row direction and the first memory cell are commonly connected to the first word line.

(Supplemental Note 9)

The semiconductor storage device according to supplemental note 7, wherein the first transistor contains: a first diffusion layer formed in a lower layer of the first lower terminal and functions as a drain; and a second diffusion layer formed in a position separated at a predetermined interval to a first orientation in the row direction from the first diffusion layer and functions as a source, wherein the first word line is formed on a substrate between the first diffusion layer and the second diffusion layer and functions as a gate of the first transistor, wherein the second transistor contains: a third diffusion layer formed in a lower layer of the second lower terminal and functions as a drain; and a fourth diffusion layer formed in a position separated at a predetermined interval to the first orientation from the first diffusion layer and functions as a source, wherein the second word line is formed on a substrate between the third diffusion layer and the fourth diffusion layer and functions as a gate of the second transistor, wherein the third transistor contains: the first diffusion layer which functions as a drain; and a fifth diffusion layer formed in a position separated at a predetermined interval to a second orientation being an opposite orientation of the first orientation from the first diffusion layer and functions as a source, wherein the second word line is formed on a substrate between the first diffusion layer and the fifth diffusion layer and functions as a gate of the third transistor, wherein the fourth transistor contains: a third diffusion layer formed in a lower layer of the second lower terminal and functions as a drain; and a sixth diffusion layer formed in a position separated at a predetermined interval to the second orientation from the third diffusion layer and functions as a source, and the first word line is formed on a substrate between the third diffusion layer and the sixth diffusion layer and functions as a gate of the fourth transistor.

(Supplemental Note 10)

7. The semiconductor storage device according to any of supplemental notes 1 to 4, further containing:

a memory array which contains the plurality of memory cells; the first word line; the second word line; and the third word line, and a row decoder configured to select a memory cell row being an access target by outputting a control signal to the first word line, the second word line, and the third word line, wherein the row decoder is configured to activate the first word line, the second word line, and the third word line connected to the memory cell being access target and inactivate other word lines.

(Supplemental Note 11)

The semiconductor storage device according to any of supplemental notes 1 to 10, wherein an angle between the longitudinal direction of the conductive layer and the column direction is 45 degree.

(Supplemental Note 12)

A manufacturing method of a semiconductor storage device containing:

a step of forming a first word line extending in a column direction;

a step of forming a second word line extending in the column direction; and a step of arranging a plurality of memory cells in the column direction and a row direction being orthogonal to the column direction, wherein the arranging the plurality of memory cells contains:

a step of forming a magnetoresistive element having a conductive layer connected to a first lower terminal and a second lower terminal;

a step of forming a first transistor whose drain is connected to the first lower terminal and whose gate is connected to the first word line; and a step of forming a second transistor whose drain is connected to the second lower terminal and whose gate is connected to the second word line, wherein the step of forming the magnetoresistive element contains a step of forming a conductive layer both end of thereof are respectively connected to the first lower terminal and the second lower terminal and a longitudinal direction is different from the column direction, and the gate of the first transistor of each of at least two memory cells among the plurality of memory cells and which are adjacent to each other in the row direction is commonly connected to the first word line.

(Supplemental Note 13)

10. The manufacturing method of the semiconductor storage device according to claim 9, wherein the step of forming the first transistor contains:

a step of forming a first diffusion layer in a lower layer of the first lower terminal and functions as a drain; and a step of forming a second diffusion layer in a position separated at a predetermined interval to a first orientation of the row direction from the first diffusion layer and functions as a source, wherein the step of forming the second transistor contains:

a step of forming a third diffusion layer in a lower layer of the second lower terminal and functions as a drain; and a step of forming a fourth diffusion layer formed in a position separated at a predetermined interval to the first orientation from the first diffusion layer and functions as a source, wherein the step of forming the magnetoresistive element contains:

a step of forming the first lower terminal on the first diffusion layer; and a step of forming the second lower terminal on the second diffusion layer, wherein the step of forming the first word line contains a step of forming the first word line which functions as agate of the first transistor on a substrate between the first diffusion layer and the second diffusion layer, and the step of forming the second word line contains the second word line which functions as a gate of the second transistor on a substrate between the third diffusion layer and the fourth diffusion layer.

(Supplemental Note 14)

The manufacturing method of the semiconductor device according to supplemental note 12, further containing:

a step of forming the third word line extending in the column direction;

a step of forming the third transistor whose drain is connected to the first lower terminal and whose gate is connected to the second word line; and a step of forming the fourth transistor whose drain is connected to the second lower terminal and whose gate is connected to the third word line, wherein the second word line is arranged between the first word line and the third word line, and in the plurality of memory cells, a second memory cell adjacent to a first memory cell in a positive orientation of the row direction and the first memory cell are commonly connected to the third word line, and a third memory cell adjacent to the first memory cell in a negative orientation of the row direction and the first memory cell are commonly connected to the first word line.

(Supplemental Note 15)

The manufacturing method of the semiconductor device according to supplemental note 14, wherein the step of forming the first transistor contains:

a step of forming a first diffusion layer which functions as a drain in a lower layer of the first lower terminal; and a step of forming a second diffusion layer which functions as a source in a position separated at a predetermined interval to a first orientation of the row direction from the first diffusion layer, wherein the step of forming the second transistor contains:

a step of forming a third diffusion layer which functions as a drain in a lower layer of the second lower terminal; and a step of forming a fourth diffusion layer which functions as a source in a position separated at a predetermined interval to the first orientation from the first diffusion layer, wherein the step of forming the third transistor contains:

a step of forming the first diffusion layer which functions as a drain; and a step of forming a fifth diffusion layer which functions as a source in a position separated at a predetermined interval to a second orientation being opposite to the first orientation from the first diffusion layer, wherein the step of forming the fourth transistor contains:

a step of forming the third diffusion layer which functions as a drain in a lower layer of the second lower terminal; and a step of forming a sixth diffusion layer which functions as a source in a position separated at a predetermined interval to the second orientation from the third diffusion layer, wherein the step of forming the magnetoresistive element contains:

a step of forming the first lower terminal on the first diffusion layer; and a step of forming the second lower terminal on the second diffusion layer, wherein the step of forming the first word line contains a step of forming the first word line as a gate of the first transistor on a substrate between the first diffusion layer and the second diffusion layer, and between the first diffusion layer and the fifth diffusion layer, and wherein the step of forming the second word line contains a step of forming the second word line which functions as a gate of the second transistor on a substrate between the third diffusion layer and the fourth diffusion layer, and between the third diffusion layer and the sixth diffusion layer.

This application is based on the Japanese Patent Application No. 2010-277866, and the disclosure of which is incorporated herein by this reference.

The invention claimed is:

1. A semiconductor storage device comprising:
a plurality of memory cells arranged in a row direction and in a column direction being orthogonal to the row direction;
a first word line extending in the column direction; and
a second word line extending in the column direction,
wherein each of the plurality of memory cells comprises:
a magnetoresistive element having a first lower terminal and a second lower terminal which are respectively connected to both ends of a conductive layer whose longitudinal direction is different from the column direction;
a first transistor whose drain is connected to the first lower terminal and whose gate is connected to the first word line; and
a second transistor whose drain is connected to the second lower terminal and whose gate is connected to the second word line,
wherein the gate of the first transistor of each of at least two memory cells among the plurality of memory cells and which are adjacent to each other in the column direction is commonly connected to the first word line.

2. The semiconductor storage device according to claim 1, wherein each of the plurality of memory cells further comprises:
a first bit line extending in the column direction and connected to a source of the first transistor;
a second bit line extending in the column direction and connected to a source of the second transistor;
wherein the first transistor in one of two memory cells among the plurality of memory cells and being adjacent to each other in the column direction and the second transistor in another one of the two memory cells are commonly connected to the first bit line, and the first transistor in the another one of the two memory cells and the second transistor in the one of the two memory cells are commonly connected to the second bit line.

3. The semiconductor storage device according to claim 2, further comprising:
a third bit line for reading being extending in the row direction and connected to an upper terminal of the magnetoresistive element,
wherein each of the first bit line and the second bit line are used as a bit line for writing.

4. The semiconductor storage device according to claim 1, wherein the first transistor comprises: a first diffusion layer formed in a lower layer of the first lower terminal and functions as a drain; and a second diffusion layer formed in a position separated at a predetermined interval to a first orientation of the row direction from the first diffusion layer and functions as a source,
wherein the first word line is formed on a substrate between the first diffusion layer and the second diffusion layer and functions as a gate of the first transistor,
wherein the second transistor comprises: a third diffusion layer formed in a lower layer of the second lower terminal and functions as a drain; and a fourth diffusion layer formed in a position separated at a predetermined interval to the first orientation from the first diffusion layer and functions as a source, and
the second word line is formed on a substrate between the third diffusion layer and the fourth diffusion layer and functions as a gate of the second transistor.

5. The semiconductor storage device according to claim 1, further comprising;
   a memory array which comprises: the plurality of memory cells; the first word line; and the second word line; and
   a row decoder configured to select a memory cell row among the plurality of memory cells being an access target by outputting a control signal to the first word line and the second word line;
   wherein the plurality of memory cells comprises:
   a first memory cell arranged in an odd-numbered row; and
   a second memory cell arranged in a position adjacent to the first memory cell and in an even-numbered row,
   wherein the first word line commonly connected to the first memory cell and the second memory cell is arranged between a word line properly connected to the first memory cell and a word line properly connected to the second memory cell; and
   the row decoder is configured to activate the first word line and the second word line which are connected to a memory cell being the access target, and inactivate word lines other than the access target.

6. The semiconductor storage device according to claim 5, wherein the first memory cell comprises the first transistor and the second transistor, and
   the second memory cell comprises:
   a magnetoresistive element having a third lower terminal and a fourth lower terminal which are respectively connected to both ends of a conductive layer whose longitudinal direction is different from the column direction;
   a third transistor whose drain is connected to the third lower terminal and whose gate is connected to the second word line; and
   a fourth transistor whose drain is connected to the fourth lower terminal and whose gate is connected to the first word line.

7. The semiconductor storage device according to any of claim 1, further comprising:
   a memory array which comprises the plurality of memory cells; the first word line; the second word line; and the third word line, and
   a row decoder configured to select a memory cell row being an access target by outputting a control signal to the first word line, the second word line, and the third word line,
   wherein each of the plurality of memory cells further comprises:
   a third word line extending in the column direction;
   a third transistor whose drain is connected to the first lower terminal and whose gate is connected to the second word line; and
   a fourth transistor whose drain is connected to the second lower terminal and whose gate is connected to the third word line,
   wherein the second word line is formed between the first word line and the third word line,
   wherein in the plurality of memory cells, a second memory cell being adjacent to the first memory cell to a positive orientation in the row direction and the first memory cell are commonly connected to the third word line, and a third memory cell being adjacent to the first memory cell to a negative orientation in the row direction and the first memory cell are commonly connected to the first word line, and
   the row decoder is configured to activate the first word line, the second word line, and the third word line connected to the memory cell being access target and inactivate other word lines.

8. The semiconductor storage device according to claim 7, wherein the first transistor comprises: a first diffusion layer formed in a lower layer of the first lower terminal and functions as a drain; and a second diffusion layer formed in a position separated at a predetermined interval to a first orientation in the row direction from the first diffusion layer and functions as a source,
   wherein the first word line is formed on a substrate between the first diffusion layer and the second diffusion layer and functions as a gate of the first transistor,
   wherein the second transistor comprises: a third diffusion layer formed in a lower layer of the second lower terminal and functions as a drain; and a fourth diffusion layer formed in a position separated at a predetermined interval to the first orientation from the first diffusion layer and functions as a source,
   wherein the second word line is formed on a substrate between the third diffusion layer and the fourth diffusion layer and functions as a gate of the second transistor,
   wherein the third transistor comprises: the first diffusion layer which functions as a drain; and a fifth diffusion layer formed in a position separated at a predetermined interval to a second orientation being an opposite orientation of the first orientation from the first diffusion layer and functions as a source,
   wherein the second word line is formed on a substrate between the first diffusion layer and the fifth diffusion layer and functions as a gate of the third transistor,
   wherein the fourth transistor comprises: a third diffusion layer formed in a lower layer of the second lower terminal and functions as a drain; and a sixth diffusion layer formed in a position separated at a predetermined interval to the second orientation from the third diffusion layer and functions as a source, and
   the first word line is formed on a substrate between the third diffusion layer and the sixth diffusion layer and functions as a gate of the fourth transistor.

9. A manufacturing method of a semiconductor storage device comprising:
   forming a first word line extending in a row direction;
   forming a second word line extending in the row direction; and
   arranging a plurality of memory cells in the row direction and a column direction being orthogonal to the row direction,
   wherein the arranging the plurality of memory cells comprises:
   forming a magnetoresistive element having a conductive layer connected to a first lower terminal and a second lower terminal;
   forming a first transistor whose drain is connected to the first lower terminal and whose gate is connected to the first word line; and
   forming a second transistor whose drain is connected to the second lower terminal and whose gate is connected to the second word line,
   wherein the forming the magnetoresistive element comprises a-step of forming a conductive layer both end of thereof are respectively connected to the first lower terminal and the second lower terminal and a longitudinal direction is different from the column direction, and
   the gate of the first transistor of each of at least two memory cells among the plurality of memory cells and which are adjacent to each other in the column direction is commonly connected to the first word line.

10. The manufacturing method of the semiconductor storage device according to claim 9, wherein the forming the first transistor comprises:
- forming a first diffusion layer in a lower layer of the first lower terminal and functions as a drain; and
- forming a second diffusion layer in a position separated at a predetermined interval to a first orientation of the row direction from the first diffusion layer and functions as a source, wherein the forming the second transistor comprises:
- forming a third diffusion layer in a lower layer of the second lower terminal and functions as a drain; and
- forming a fourth diffusion layer formed in a position separated at a predetermined interval to the first orientation from the first diffusion layer and functions as a source, wherein the forming the magnetoresistive element comprises:
- forming the first lower terminal on the first diffusion layer; and
- forming the second lower terminal on the second diffusion layer, wherein the forming the first word line comprises forming the first word line which functions as a gate of the first transistor on a substrate between the first diffusion layer and the second diffusion layer, and the forming the second word line comprises the second word line which functions as a gate of the second transistor on a substrate between the third diffusion layer and the fourth diffusion layer.

\* \* \* \* \*